United States Patent [19]

Homma et al.

[11] Patent Number: 4,858,184
[45] Date of Patent: Aug. 15, 1989

[54] RADIATION RESISTANT BIPOLAR MEMORY

[75] Inventors: Noriyuki Homma, Kodaira; Tohru Nakamura, Tanashi; Kazuo Nakazato, Kokubunji; Motoaki Matsumoto, Ome; Tetsuya Hayashida, Tokyo; Masaharu Kubo, Hachioji; Kazuhiko Sagara, Tokyo, all of Japan

[73] Assignee: Hitachi, Ltd., Tokyo, Japan

[21] Appl. No.: 42,698

[22] Filed: Apr. 27, 1987

[51] Int. Cl.⁴ ............................................. G11C 11/40
[52] U.S. Cl. ..................................... 365/174; 365/53; 307/321
[58] Field of Search ................. 365/174, 228, 100, 53; 307/321, 477

[56] References Cited

U.S. PATENT DOCUMENTS 3,618,052 11/1971 Kwei .................................... 365/100

Primary Examiner—Terrell W. Fears
Attorney, Agent, or Firm—Antonelli, Terry & Wands

[57] ABSTRACT

A bipolar memory of a construction having high immunity to soft error attributable to alpha rays is provided. The transistors of a flip flop, i.e., the essential circuitry of the memory cell, are inverted and the load device thereof has shielding means for shielding the flip flop from the noise produced within the substrate. Bipolar transistors and Schottky barrier diodes are employed as the load devices. A buried layer (ordinarily, an n type layer) and a doped layer of the reverse conductivity type (ordinarily the p type) are formed in a region where the device is provided, and a reverse bias is applied across the buried layer and the doped layer to shut off the noise produced within the substrate.

12 Claims, 36 Drawing Sheets

RADIATION RESISTANT BIPOLAR MEMORY

BACKGROUND OF THE INVENTION:

1. Field of the Invention

The present invention relates to a semiconductor memory and, more particularly, to a bipolar memory having improved immunity to soft error attributable to the noise created by radiation such as alpha rays.

Further, the present invention relates to a high-speed diode construction resistant to noise from the substrate, employed as a load for the above-mentioned bipolar memory.

Still further, the present invention relates to a high-performance vertical transistor construction resistant to noise from the substrate, employed as a load for the above-mentioned bipolar memory.

2. Description of the Prior Art

It is a well-known fact that the incidence of alpha particles, though of a very small amount, radiated from the material forming the package (a container accommodating a semiconductor chip) into a semiconductor substrate produces electron-hole pairs, which can easily destroy the information stored in the semiconductor memory. Such destruction of information was found first in MOS memories. Thereafter, soft error has been found also in bipolar memories; and contriving measures to obviate soft error has been a significant problem in designing semiconductor memories.

Prior to the description of the present invention, the process of soft error in the bipolar memory attributable to alpha rays will be described.

FIGS. 1A to 1I are circuit diagrams of widespread conventional typical bipolar memory cells. The cells of FIGS. 1A to 1E have constructions securing high-speed operation at a low power consumption rate. In the non-selected state, a stand-by current is supplied to a load resistor having a high resistance to obtain a desired voltage swing, while in the selected state, the load is changed to a load having a low impedance in order to supply a large read (or write) current. FIGS. 1F to 1I show cross-coupled pnpn cells particularly suitable for constructing a compact device. These cells are compact and suitable for constructing a large-capacity device, however, when an additional capacitance is given thereto to reinforce the alpha ray resistance, the memory cell area is increased to disadvantage.

FIG. 2 is a typical plan view of the memory cell of FIG. 1A. In FIG. 2, there are shown the terminals 3C, 3B and 3E for the collector, the base and the emitter, respectively. FIG. 3 is a sectional view taken along line aa' of FIG. 2. In FIG. 3, n⁻ layer (epitaxial layer) 36 and n+ buried layer (n+ BL) 30 are a collector region. The diode of FIG. 1A is formed between a p+ layer 31 and the n+ BL 30. The resistance 12 (FIG. 1A) is formed by a p layer 32 and the transistors (FIG. 1A) are formed by emitter n+ layers 33 and 34 and by a base p+ layer 35 and the n− layer 36. Indicated at 301 is a thick insulating film for separating the devices.

When radiation, such as alpha rays, including the radiation radiated from the components of the IC, such as the package, and cosmic rays falls on the memory cell having such a sectional construction, a large amount of electron-hole pairs are produced within the semiconductor, as illustrated in FIG. 3. As illustrated in FIG. 3, more electron-hole pairs are produced within a silicon substrate 37 supporting the component devices (transistors, resistors, diodes and the like) of the memory cell than within those component devices. (Typically, the thicknesses of the n⁻ Ep layer 36 and the n+ BL layer 30 are 1 to 2 μm, whereas the range of alpha particles is as large as 50 to 70 μm.) The electrons of the electron-hole pairs produced within the silicon substrate diffuse and approach the n+ BL 30. Upon the arrival at the depletion layer between the n+ BL 30 and the silicon substrate 37 (p-substrate), the electrons are accelerated by the electric field of the depletion layer and reach the n+ BL layer 30 (the collector of the transistors). These electrons are the principal cause of soft error in the memory LSI by alpha rays. That is, these electrons produce a noise current and, when a large noise current is produced, the stored information is destroyed. As an example, suppose that the n+ BL 30 in which the electrons collect is the collector of the off-side transistor of FIG. 1A, the electrons enter the collector of the off-side transistor, namely, the base of the on-side transistor 18, as illustrated in FIG. 1A. Thereby, the base voltage of the transistor 18 drops and the on-side transistor tends to become an off-state. When the charge of the electrons is large, the base voltage of the transistor 18 drops below the base voltage of the transistor 19, and thereby, the stored information is inverted.

Means previously taken to prevent such soft error include: (1) preventing the incidence of alpha rays, (2) suppressing the accumulation of charge when the incidence of alpha rays occurs, or (3) providing the memory cell with noise current resistant characteristics. The first means is a well-known means in which the surface of the chip is coated with a film of a substance not containing any source of alpha rays having a thickness not less than several tens of microns. According to this means, the film having a thickness greater than the range of alpha rays, namely, the possible distance of intrusion of alpha rays into a substance, prevents alpha rays from reaching the silicon substrate. As the second means, appropriately controlling the distribution of the impurity concentration in the silicon substrate has been proposed. As the third means, inserting a capacitor between the collector node and the ground or a node equivalent to the ground from the viewpoint of AC has been proposed.

FIGS. 4A to 4C show examples of such means to prevent alpha rays. In the example shown in FIG. 4A, capacitors are inserted between the collectors and the grounds, respectively, of the memory cell. The insertion of the capacitors suppresses the variation of the potential of the collectors even if a noise current is produced, and hence the possibility of soft error is reduced. The insertion of the capacitors as illustrated in FIG. 4A enhances the immunity to soft error attributable to alpha rays, however, the time constant of the collector becomes large, which affects adversely to the high-speed performance of the bipolar memory. When capacitors are inserted as illustrated in FIG. 4B, the capacitors function as a speed-up capacitor when the memory cell is driven, and hence this insertion of the capacitors improves both the operating speed and the immunity from alpha rays. However, those capacitors need to have a relatively large capacitance (not less than several fractions of a picofarad), and hence it is difficult to apply the configuration of FIG. 4A to a practical memory cell. The example shown in FIG. 4B is disclosed in Japanese Unexamined Patent Publication No. 54-29935. A memory cell illustrated in FIG. 4C is an example of a memory cell developed by solving the above-mentioned problem. This memory cell employs the depletion capacitance of a Schottky barrier diode (abbreviated to "SBD" hereinafter) as a capacitor. This SBD is more capable of providing a large capacitance comparatively easily than an ordinary pn junction by increasing the impurity concentration of the silicon substrate. Although three means of improving the immunity of the memory cell to alpha rays has been described hereinbefore, none of then is sufficiently effective when applied individually. Practically, the combination of the first and third means is employed. The example shown in FIG. 4C is disclosed in Japanese Unexamined Patent Publication Nos. 53-79331 and 53-97343.

In the initial stage of microminiaturization, the ratio of an SBD to the memory cell in area was 10% or less, and hence the employment of an SBD or the like as an additional capacitance was satisfactory. However, since a certain satisfactory degree of the immunity from alpha rays requires a capacitance of a fixed value, the ratio of the SBD to the memory cell in area has increased with the advancement of micro-miniaturization and the area of the memory cell has not been decreased according to the miniaturization. When microminiaturized, the parasitic capacitance of the memory cell is reduced, whereas the capacitance of the SBD remains unchanged. Consequently, the capacitance of the SBD becomes greater than ten times the other capacitance, which deteriorates the stability of the memory cell. (Concretely, when the memory cell is changed over between the selected state and the non-selected state, the signal swing is reduced to an extremely small extent.)

SUMMARY OF THE INVENTION

It is an object of the present invention to provide a compact memory cell having improved immunity to soft error attributable to radiation which does not need any additional capacitor.

It is another object of the present invention to provide a stable memory cell having improved immunity from soft error attributable to radiation which does not need any large capacitor.

It is a further object of the present invention to provide a construction ensuring the stable operation of an SBD, which is an important element as the load of a very large scale integrated circuit, particularly, as the load of a bipolar memory, regardless of noise signals produced in the substrate, in order to realize a minute device.

It is a still further object of the present invention to provide a novel construction of a vertical transistor without the disadvantages of a lateral transistor, which is an important element as a load of a very large scale integrated circuit, particularly, that of a bipolar memory.

According to the present invention, the influence of radiation on the memory is reduced to the least extent through the inverse operation of a transistor. That is, the electrons produced by the stimulation of radiation, such as alpha rays, are collected to affect the emitter side through the inverse operation of an ordinary bipolar transistor.

Furthermore, according to the present invention, a load device and a transistor are formed individually in separate isolation areas to enhance the operating speed.

Still further, according to the present invention, a pnp transistor employed as a load device is operated inversely.

Furthermore, according to the present invention, a shield layer is formed under a pnp transistor or an SBD employed as a load device, as a barrier against electrons produced by the stimulation of radiation such as alpha rays.

Thus, according to the present invention, a thin p type layer is formed over an n type buried layer to isolate the substrate electrically from a pnp transistor or an SBD in order to enable the pnp transistor or the SBD to operate stably regardless of the local potential of the substrate.

According to the present invention, a bipolar transistor is connected in parallel with a load to enable large-current operation.

The above and other objects, features and advantages of the present invention will become more apparent from the following description of the preferred embodiments thereof taken in conjunction with the accompanying drawings.

DETAILED DESCRIPTION OF THE INVENTION

The present invention will be described in detail hereinafter with reference to the preferred embodiments thereof. The following description consists generally of three sections.

In the first section, the memory cell of an inverse operating bipolar transistor is described in detail.

In the second section, improvements in an SBD for the load of a bipolar memory are described in detail.

In the third section improvements in a pnp transistor for the load of a bipolar memory are described in detail.

Embodiment 1

Figure 3:
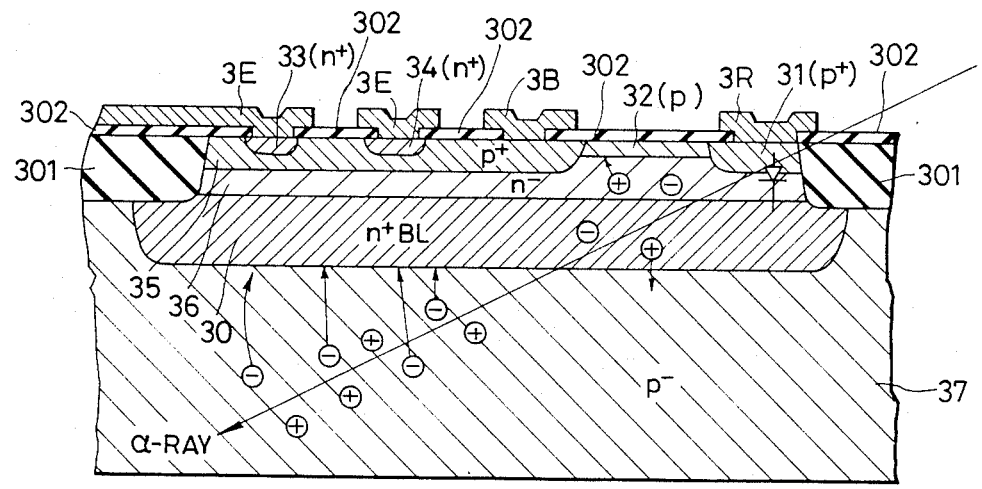
Figure 5A:
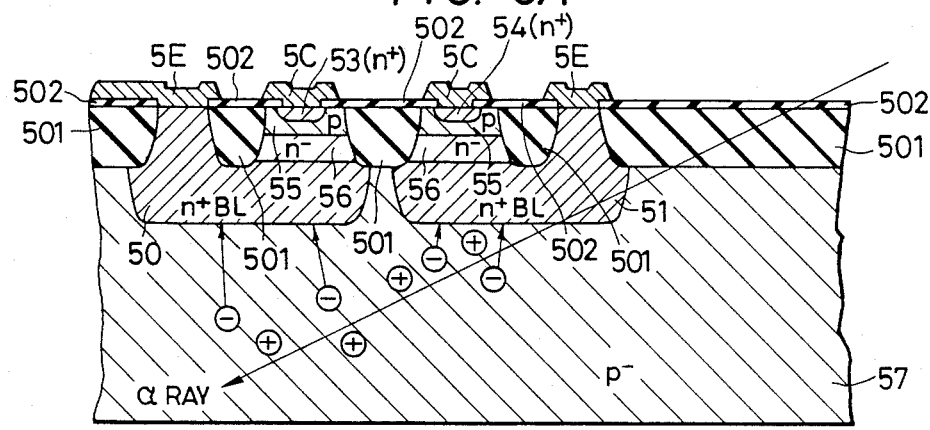
FIGS. 5A to 5C, 6, 7A and 7B are illustrations useful for explaining the basic constructions of memory cells according to the present invention.
Figure 6:
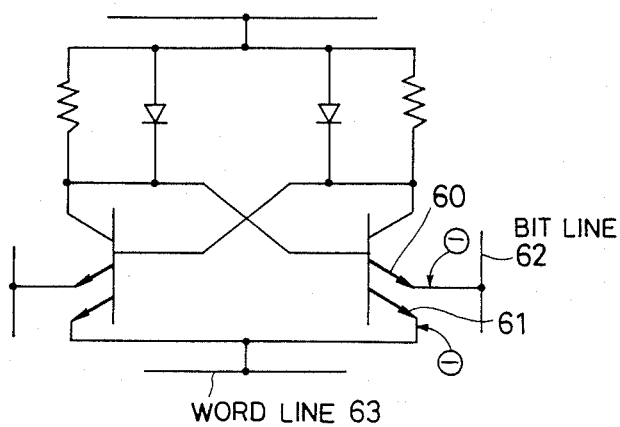

FIG. 5A is a sectional view of a double-emitter transistor of a memory cell, in a first embodiment, according to the present invention, and FIG. 6 is a circuit diagram of an equivalent circuit of the double-emitter transistor of FIG. 5A. In this embodiment, the conventional collector and emitter are used as the emitter and collector, respectively, of a transistor. Accordingly, an n+ BL 50 and an n+ BL 51 of FIG. 5A correspond to an emitter 60 and an emitter 61 of FIG. 6, respectively. In FIG. 6, the emitters 60 and 61, namely, n+ BLs, are indicated by bold lines. Thus, the electrons gathered in the n+ BLs 50 and 51 are collected by a bit line 62 and a word line 63, respectively, and hence the charge of these electrons does not cause soft error. Accordingly, only the charge produced in the transistor portion formed above the n+ BLs, namely, n+, p and n− layers in FIG. 5A, involves the soft error attributable to alpha rays. As apparent from the drawings, only a small amount of charge, as compared with that produced in the p type silicon substrate, is produced in the transistor portion (actually, even in the worst case, the amount of charge produced in the transistor portion is approximately one-tenth of that produced in the p type silicon substrate). Thus, the memory cell of the present invention is inherently immune to soft error attributable to alpha rays. FIGS. 3 and 5A illustrates examples of memory cells formed by oxide isolation technology, however, naturally, the memory cells may be formed by any suitable isolation technology.

Figure 7A:
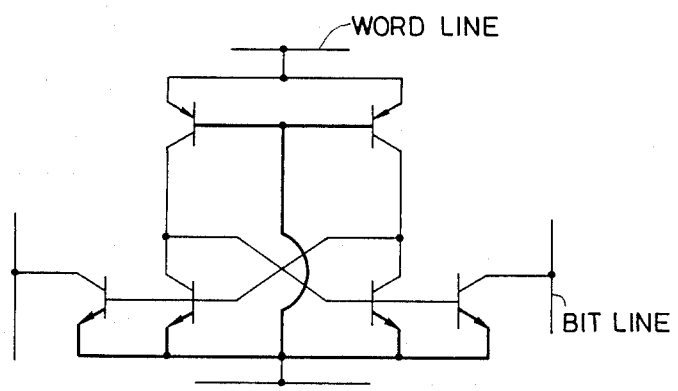
Figure 7B:
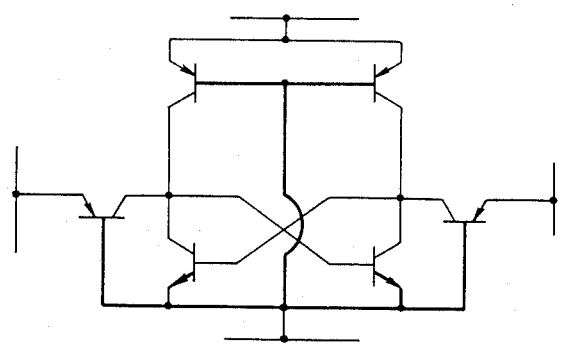

Incidentally, the use of an n+ BL and a conventional emitter as an emitter and a collector of a transistor, respectively, is well known as so-called I$^2$L. Two representative I$^2$L memory cells (Wiedmann, S. K. "Injection-coupled Memory: A High-density Static Bipolar Memory", IE$^3$ J. of Solid State Circuits, SC, pp. 332, Oct., 1973; and Kawarada, K. et al., "A 4K-bit Static I$^2$L Memory", IE$^3$ Trans. on Electron Devices, vol. ED-26, No. 4, pp. 886, June, 1979) are shown in FIGS. 7A and 7B, in which bold lines indicate n+ BLs. As apparent from the figures, in the I$^2$L memory cell, both the load pnp transistor and a coupling transistor (npn or pnp transistor) for a bit line have, in common, the same n+ BL for the npn transistor constituting the flip-flop, that is, the transistors are formed on the same n+ BL and they each use the n+ BL as part thereof. It is therefore considered that the I$^2$L memory cell can have an α-ray resistance comparable to that achieved by the present invention. In the I$^2$L memory cell, however, all the transistors constituting the memory cells are very deeply saturated, which, together with the intrinsic operation mechanism, makes it impossible to perform high-speed reading and writing.

According to the present invention, the n+ BL 50 of the transistor for the flip-flop and the n+ of the load device and/or the bit line coupling device are separated from each other, and are formed respectively on different silicon islands. Accordingly, the memory cell of the present invention can achieve a by far higher speed than that achieved by the I$^2$L, though the cell, area is somewhat increased as compared with that of the I$^2$L memory cell.

Figure 5B:
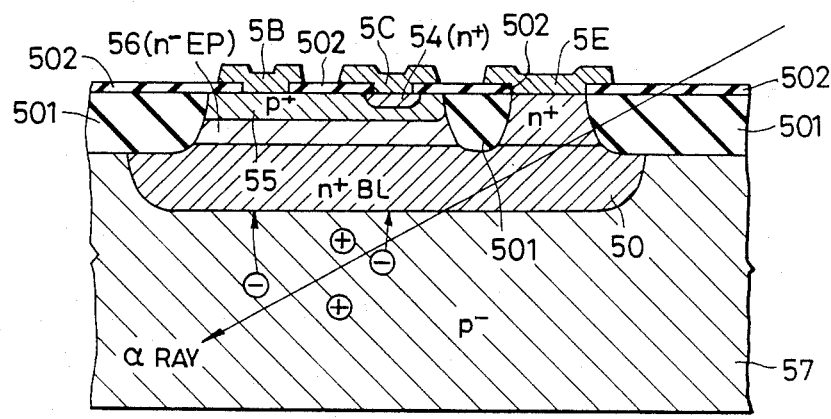

FIG. 5B illustrates an example of the transistor for use in the present invention. In the present invention, all the transistors are inversely connected, that is, the emitter and the collector are interchanged. As illustrated in FIG. 5B, an n+ BL is used as an emitter. Therefore, electrons produced by alpha rays gather in the collector in a conventional memory cell, whereas the same electrons gather in the emitter in the memory cell of the present invention. As apparent from the circuit diagrams of FIGS. 1A to 1I, since the emitter of the memory cell transistor is connected to a word line (lower word line) or a bit line, the electrons gathered in the emitter are collected in the word line or the bit line. Since the word line and the bit line are provided with large capacitors (about 10 pF), the potential variation is, at the maximum, about 50 mV even if all the electrons produced by alpha rays (about $5 \times 10^{-13}$ C at the maximum) gather in one n+ BL Besides, the word line or the bit line is charged or discharged by the memory cell or the transistors of the peripheral circuit when potential variation occurs in the word line or bit line (low impedance also in DC operation), and hence, practically, the potential variation is suppressed still further, so that soft error in the memory cell or the malfunction of the same does not occur. In FIG. 5B, a transistor manufactured through the oxide isolation process is shown by way of example, however, the transistor may be manufactured through any suitable process.

Figure 5C:
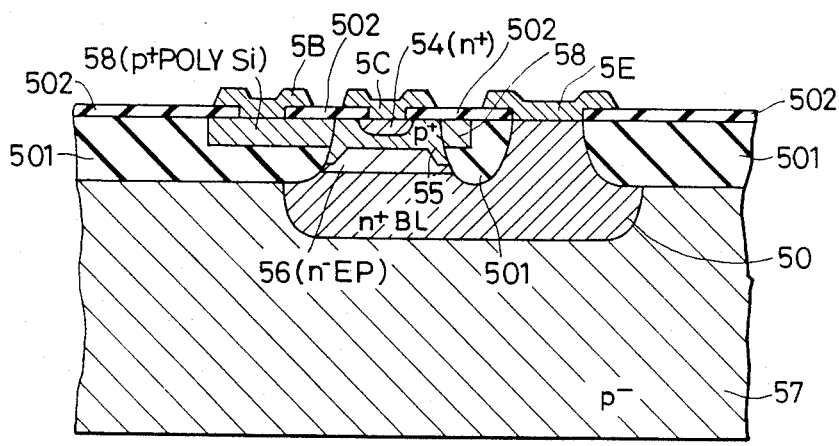

Incidentally, in the transistor having a construction as shown in FIG. 5, the collector region 54 is considerably smaller than the emitter region 56 (n− EP). Accordingly, only a small portion of the charge supplied from the emitter to the base reaches the collector, and thereby h$_{FE}$ is reduced. FIG. 5C illustrates a transistor having an improved construction eliminated of such a drawback, in which a p+ type polycrystalline silicon layer 58 for base contact is formed on the side wall of the transistor (Japanese Unexamined Patent Publication No. 56-1556). The emitter region 56 and the collector region 54 of this transistor have the substantially same area, therefore, the characteristics, such as h$_{FE}$ and f$_T$, of this transistor are substantially the same in the inverse operation and normal operation. Thus, the following embodiments of the present invention will be described as employing transistors having a construction as illustrated in FIG. 5C. Naturally, transistors of any construction are applicable to the present invention, provided that they are inverted.

Embodiment 2

A second embodiment of the present invention will be described hereinafter. The second embodiment is a bipolar memory cell employing an SBD as a load device. The SBD employed in the embodiment as the load device is provided with a shield layer for inhibiting the intrusion of electrons produced in the substrate into the bipolar memory cell. The second embodiment is capable of high operating speed (high read and write speed) which is higher than that: of a third embodiment of the present invention which will be described afterward.

Figure 8A:
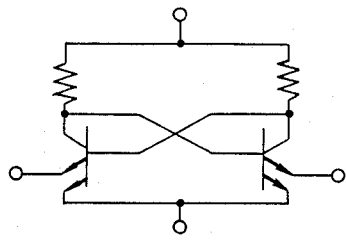
FIGS. 8A through 31 are illustrations useful for explaining constructions of memory cells employing shield SBDs as loads, respectively.
Figure 8D:
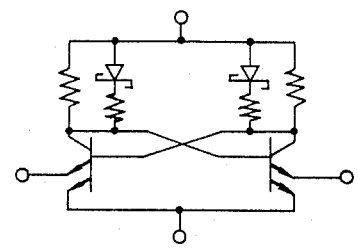
Figure 8B:
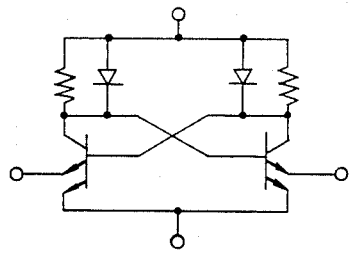
Figure 8E:
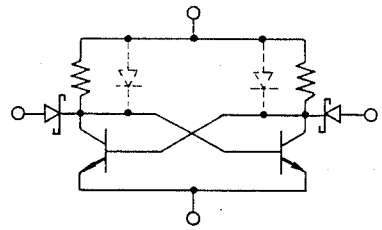
Figure 8C:
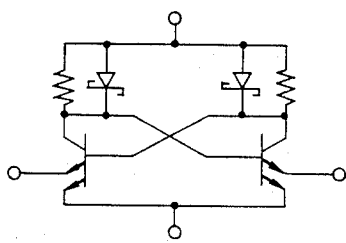
Figure 8F:
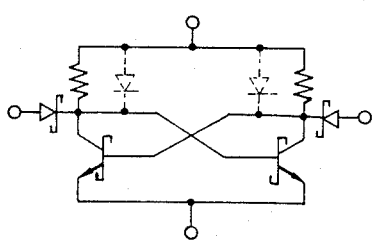
Figure 9A:
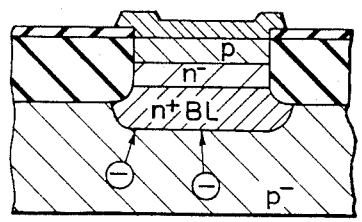
Figure 9B:
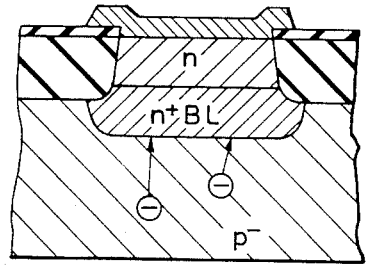

FIGS. 8A to 8F and 9A to 9D illustrate examples of representative memory cells according to the present invention. FIG. 8A illustrates a flip flop having resistors as loads, employing an npn transistor as a bit line coupling device. According to the present invention, the flip flop transistor and the bit line coupling transistor are inverted (the n+ BL is used as an emitter). The emitters are indicated by bold lines. In the drawings illustrating other memory cells, bold lines indicate n+ BLs used as emitters in the inverted connection. Any resistor may be employed as the load resistor of the collector, however, preferably, a resistor which is immune to a noise current produced by alpha rays, for example, a polycrystalline silicon layer formed over an insulating layer is employed, which will be described afterward. A memory cell shown in FIG. 8B is the same as that shown in FIG. 6. When this memory cell is provided with an ordinary junction diode such as shown in FIG. 9A, electrons produced by alpha rays gather in an n+ BL serving as a cathode. Naturally, since the transistor itself produces noise current scarcely, this memory cell is sufficiently immune from alpha rays as compared with the conventional memory cell. However, it is desirable that the load resistor and the diode each have a construction which is not subject to the influence of noise current produced by alpha rays, in order to further enhance the immunity of the memory cell from alpha rays. Such a purpose can be achieved by a polycrystalline silicon diode formed over an insulating film. FIG. 8C illustrates a memory cell in which the collector of a memory cell transistor is clamped with an SBD. When the SBD is such a conventional SBD as illustrated in FIG. 9B, electrons gather at the cathode. Therefore, it is desirable that this SBD also is immune from noise current produced by alpha rays. FIG. 8D illustrates a memory cell also employing an SBD, which, desirably, has the same construction as that of an SBD which will be described with reference to FIG. 8E. FIGS. 8E and 8D illustrate memory cells each employing an SBD as a bit line coupling device, in which the diodes indicated by broken lines may be omitted. Desirably, these memory cells also are provided with load devices which are immune from noise current produced by alpha rays. Prior to the description of the rest of the embodiments, such load device will be described in connection with memory cells of the present invention corresponding to the circuit shown in FIG. 1B or 1C.

Figure 1A:
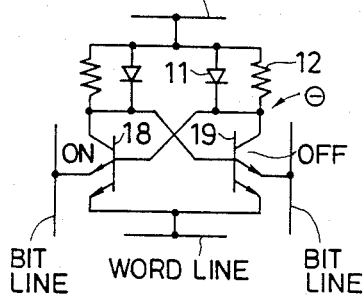
FIGS. 1A to 1I, 2, 3 and 4A to 4C are illustrations showing the examples of conventional memory cells.
Figure 10:
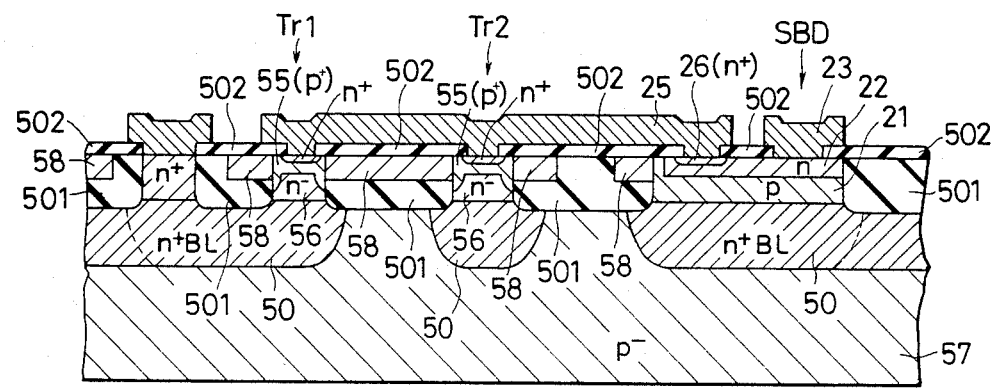

FIG. 10 illustrates, in a sectional view, a portion of a memory cell according to the present invention, including transistors Tr1 and Tr2 and an SBD. As mentioned above, the transistors Tr1 and Tr2 are inverted. One of the transistors Tr1 and Tr2 is a transistor for read current and the other is a transistor for stand-by current; and either the former or the latter may be used for either purpose. However, in view of the convenience of layout, it is general to use the transistor Tr1 for read current and the transistor Tr2 for stand-by current. It is convenient from the viewpoint of layout, regardless of the purposes of the transistors Tr1 and Tr2, to use an n+ BL 50 commonly both for the transistor Tr1 and an adjacent transistor (a transistor equivalent to the transistor Tr1) on the left-hand side of the transistor Tr1. It is also convenient to use the n+ BL of the transistor Tr2 commonly both for the transistor Tr2 and an adjacent transistor (a transistor equivalent to the transistor Tr2) formed above or below, as viewed in the drawing, the transistor Tr2 in the same memory cell. It is also possible to use the n+ BL of the transistor Tr2 of an adjacent cell disposed above or below the present memory cell, as viewed in the drawing, commonly both for the transistors Tr2 of the adjacent memory cells. Naturally, the n+ BLs of the transistors Tr1 and the transistor equivalent to the transistor Tr1 may be formed separately as indicated by broken lines in FIG. 10. The memory cell of the present invention employs a shield SBD so that the charge produced in the p− substrate will not gather at the cathode. That is, the SBD is formed between an electrode 23 and an n type semiconductor 22. A p type layer 21 and an n+ BL 50 are formed between the n type layer 22, i.e., the cathode of the SBD, and a p− type substrate 57. The n+ BL 50 and a p type layer 21 are only to be connected, similarly to the n+ BLs (emitters) of the transistors Tr1 and Tr2, to a node which is unaffected by noise current, such as a bit line, a signal line similar to a bit line, simply, to a power source of a suitable potential or, most preferably, a word line. The p type layer 21 is connected to such a node through a p type polycrystalline silicon layer 58 having the same construction as or similar to that of the polycrystalline silicon layer for base contact of the transistor. The potentials of the p type layer 21 and the n+ BL 50 need to meet a condition that the junctions between the substrate 57 and the n+ BL 50, between the n+ BL 50 and the p type layer 21, and between the p type layer 21 and the n type layer 22 are in reverse bias. In the construction shown in FIG. 10, when potentials meeting such a condition are applied to the regions, respectively, the noise current flows toward the n+ BL 50, hence toward the node or the power source connected to the n+ BL 50 and does not reach the n type layer 22. Since the n type layer 22 is connected through an electrode 25 to the collectors of the transistors Tr1 and Tr2, the noise current produced by alpha rays does not flow into the collector node of the memory cell (except only a very little noise current produced in the n type layer 22 and the p type layer 21), and hence soft error is prevented. As illustrated in FIG. 10, it is possible to form a common n+ BL instead of separately forming the n+ BL 50 of the SBD and the n+ BL of the adjacent SBD. However, the n+ BLs may be formed separately as indicated by broken lines in FIG. 10 when preferred from the viewpoint of layout. The electrode 25 is connected through an n+ BL 26 to the n type layer 22. When a resistor is connected in series to the SBD in the memory cell of FIG. 10 as illustrated in FIG. 1C, it is possible to form a resistor between the n type layer formed directly below the SBD and the n+ BL 26 by appropriately designing the impurity concentration of the n type layer 22 and the distance between the electrode 23 and the n+ BL 26. The resistor connected in parallel to the SBD (or a series circuit consisting of the SBD and the resistor) may be a conventional resistor of any type.

Figure 11:
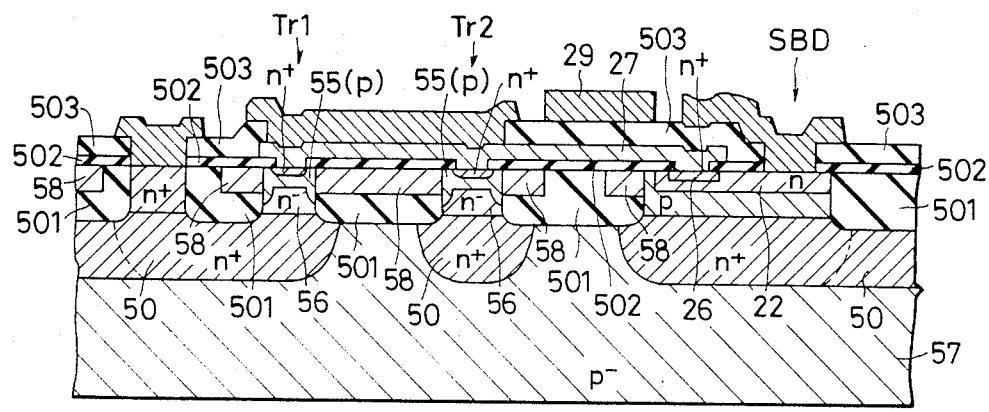

FIG. 11 illustrates a memory cell in which the n+ BL 26 of an SBD and the collectors of transistors Tr1 and Tr2 are interconnected by an n+ polycrystalline silicon layer 27. In implanting emitter impurity through a polycrystalline silicon layer by the ion implantation process or in forming an emitter through diffusion from an n+ polycrystalline silicon layer, such a construction permit the use of the polycrystalline silicon layer as the n+ polycrystalline silicon layer 27, which is convenient. In a memory cell of such a construction, an insulating layer 503 formed over the polycrystalline silicon layer 27 reduces the irregularity of the surface of the IC and reduces the area of the memory cell since an electrode 29 can be formed over the insulating layer 503. A series circuit of the SBD of the memory cell of FIG. 11 and a resistor can be formed by using the resistor of the n type layer 22 similarly to the series circuit of the memory cell of FIG. 10, however, it is also possible to form such a series circuit by appropriately designing the shape and specific resistance of the n+ polycrystalline silicon layer 27.

Figure 1B:
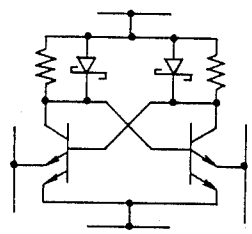
Figure 1C:
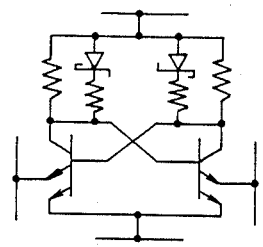
Figure 1D:
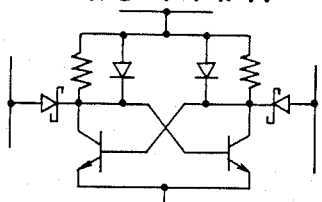
Figure 12:
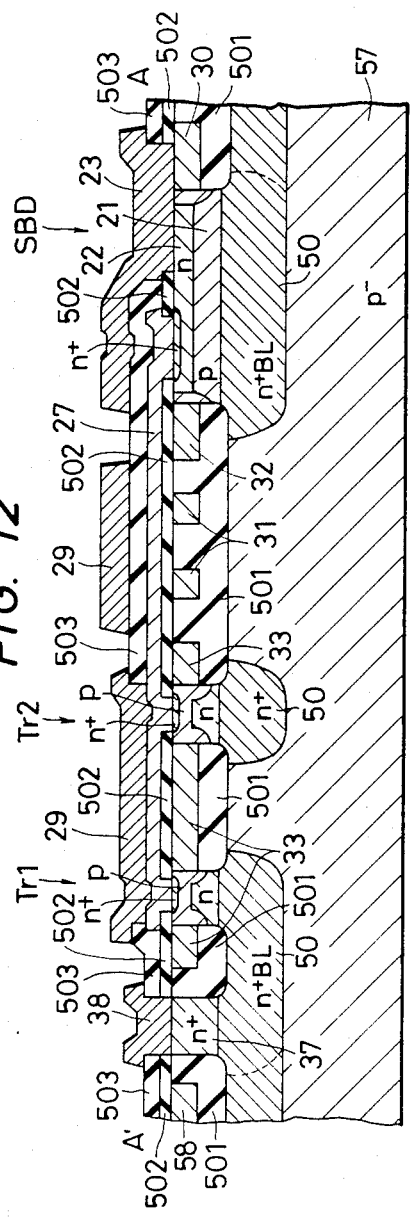
Figure 13:
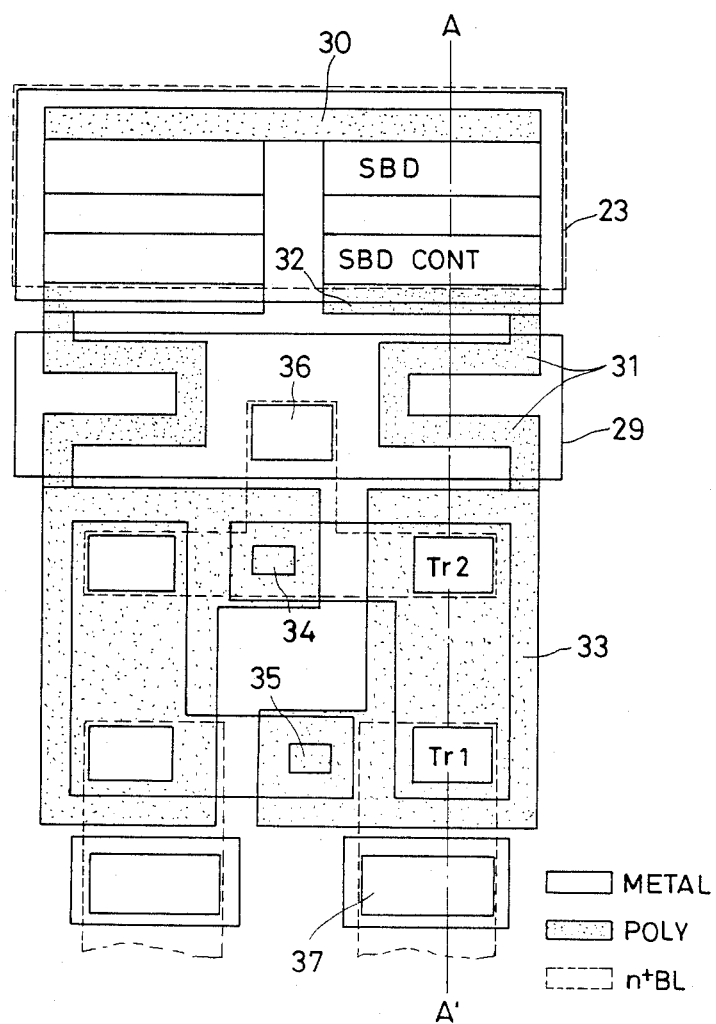

FIGS. 12 and 13 are a sectional view and a plan view, respectively, of a complete memory cell corresponding to that of FIG. 1B. FIG. 12 shows a section taken along line A-A' of FIG. 13. Electrodes 23 and 29 correspond to the upper word line and the lower word line of FIG. 1B, respectively. A p− type polycrystalline silicon layer 31 forms a resistance. One end of the resistance is connected to the electrode 23 through a p+ polycrystalline silicon layer 32, the p type region 21 of an SBD and a polycrystalline silicon layer 30. The other end of the resistance is connected through a polycrystalline silicon layer 33 to the bases of transistors Tr1 and Tr2. The emitter (n+ BL) of the transistor Tr2 is connected to another transistor Tr2 of the memory cell and to the electrode 29 (lower word line) through a contact hole 36. On the other hand, the emitter (n+ BL) of the transistor Tr1 is a common emitter for both this memory cell and an adjacent memory cell, not shown, disposed below this memory cell. This emitter is connected through a contact hole 37 to the electrode 28. Practically, an electrode 38 is connected through a via hole to a second metal layer (bit line), which is omitted in FIGS. 12 and 13. The cathode contact of an SBD is connected through an n+ polycrystalline silicon layer 27 to the collectors of the transistors Tr1 and Tr2, which is not illustrated in FIG. 13 for simplicity. An n+ BL 50 is connected to a suitable power source at the end of the memory cell array.

Figure 14:
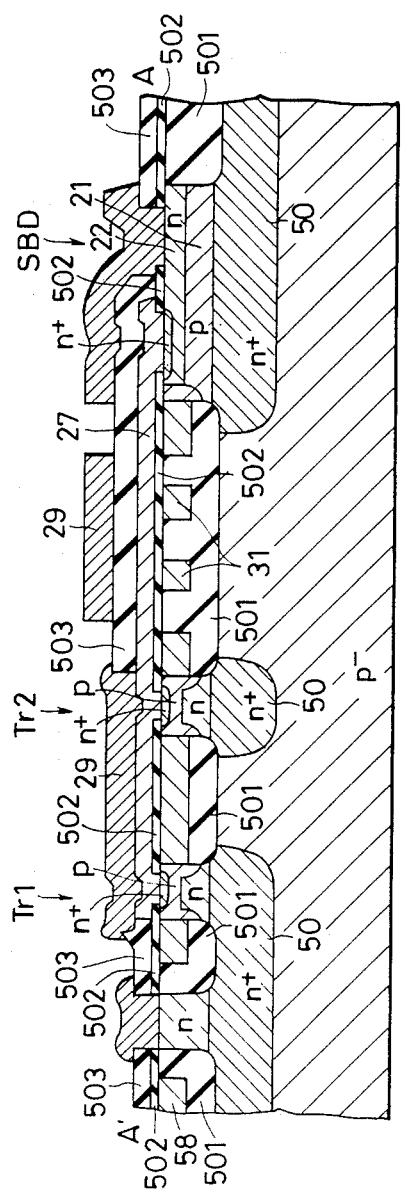
Figure 15:
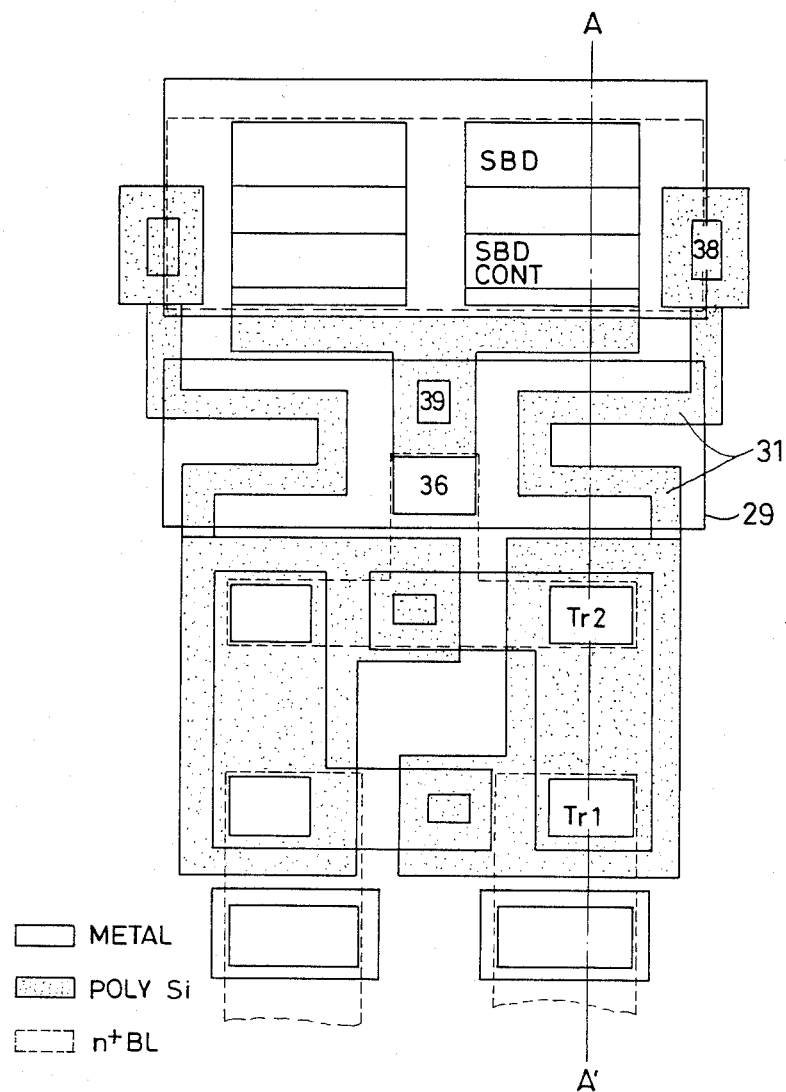

FIGS. 14 and 15 are a sectional view and a plan view, respectively, of an embodiment of the memory cell of FIG. 1C. This embodiment differs from the embodiment of FIGS. 12 and 13 only in that a resistor is connected in series to the SBD by properly designing the respective sheet resistances of the n type layer of the SBD and the n+ polycrystalline silicon layer 27 (in the embodiment of FIGS. 12 and 13, the voltage drop across this portion affects little to the operation of the memory cell, and hence the voltage drop is negligible), the p type layer 21 is not used for connecting the resistor 31 because it is possible that the n type layer 22 and the p type layer 21 are connected due to voltage drop across the n type layer 22, and the resistor 31 is connected directly to the word line by an electrode 38. In this embodiment, the p type layer 21 is held at a suitable potential (a potential that applies a reverse bias to the n type layers 22 and 20). The p type layer 21 is connected to the lower word line 29 by a metal layer 39 as illustrated in FIG. 15. The n+ BL 50 may be connected to a power source of an appropriate voltage so that the n+ BL 50 is in reverse bias relative to the potential of the lower word line 29. In FIG. 15, the n+ polycrystalline layer 27 is omitted for simplicity.

Figure 16:
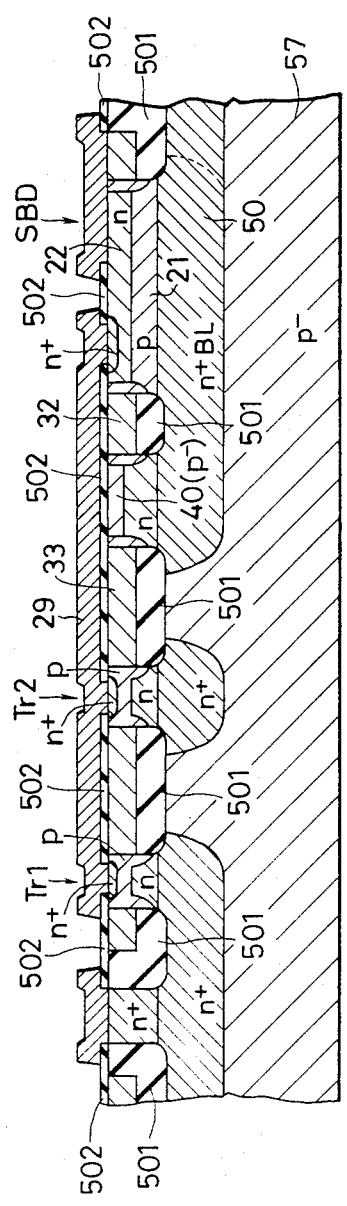

FIG. 16 illustrates a further embodiment having a resistor formed in a single crystal silicon instead of a polycrystalline silicon resistor 31 of the embodiment of FIG. 12. The resistor is formed in a p− layer 40 between a p+ polycrystalline silicon layers 32 and 33. In this embodiment, a metal layer is employed instead of an n+ polycrystalline silicon layer for interconnecting the cathode of the SBD and the collectors of the transistors.

Figure 17:
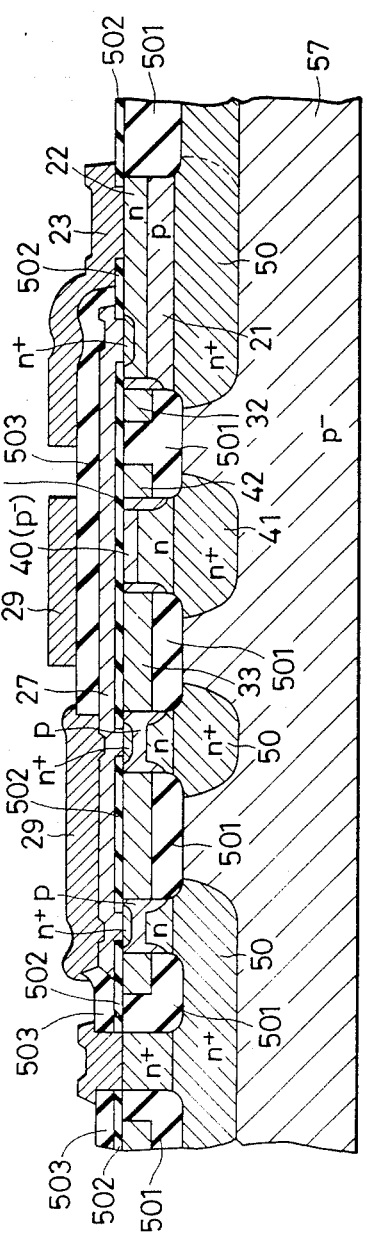

FIG. 17 illustrates an embodiment employing a p− single crystal silicon layer as a resistor instead of the polycrystalline silicon resistor employed in the embodiment of FIG. 14. A p− type layer 40 is formed between polycrystalline silicon layers 42 and 33 as a resistor. In this embodiment also polycrystalline silicon layers 32 and 42 are formed separately to prevent the junction from becoming conductive due to voltage drop across an n type layer 22. The polycrystalline silicon layer 42 is connected to a word line 23 in the same manner as that shown in FIG. 15. An n+ BL 41 and an n+ BL 50 are formed separately. The n+ BL 41 is held at a suitable potential for example, the word line potential for the polycrystalline silicon, layer 42, so that the p− layer 40 will not pinch off.

Figure 18:
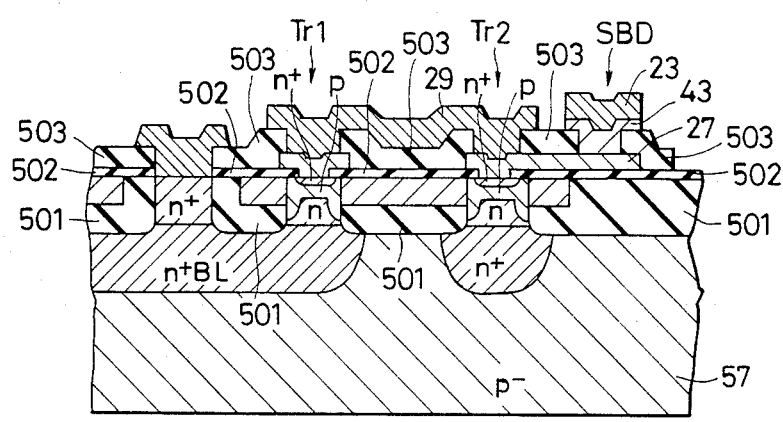

FIG. 18 illustrates an embodiment employing an SBD formed by a polycrystalline silicon layer and a metal electrode, namely, a layer of any metallic material, such as Al, AlSi, PtSi, Pd$_2$Si or W, which is capable of forming an SBD together with silicon. Apparently, noise current does not flow from the p− type substrate into this SBD. The SBD is formed by an electrode (word line) 23 and an n type polycrystalline silicon layer 43. An n+ type polycrystalline silicon layer 27 is doped with an impurity through ion implantation of diffusion to form the collector (an emitter in the conventional construction) of a transistor and to connect the cathode of the SBD to the collector of a transistor Tr2.

Figure 19:
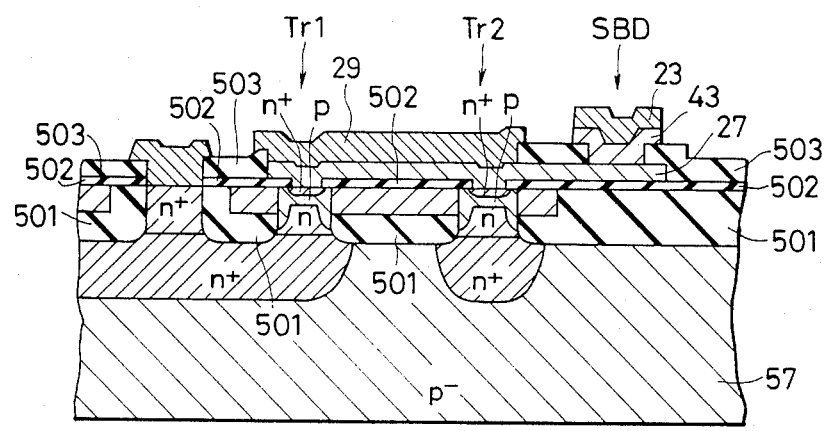

FIG. 19 illustrates a still further embodiment, in which an n+ polycrystalline silicon layer 27 connects the cathode of an SBD to the collectors of two transistors Tr1 and Tr2.

Figure 20:
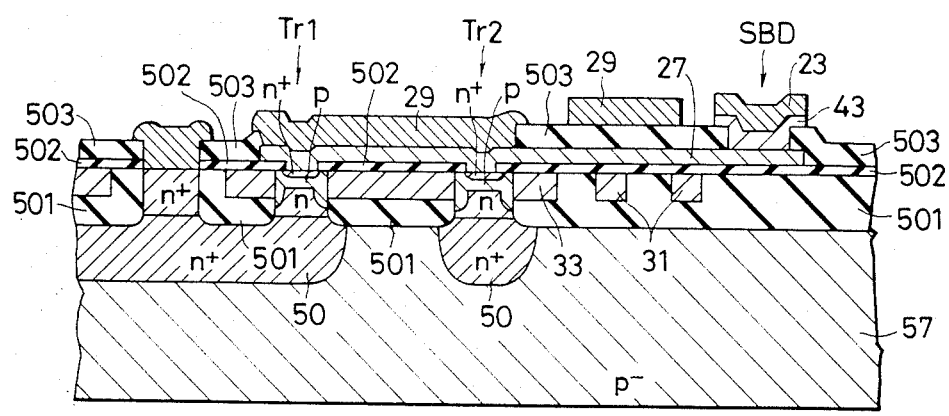

FIG. 20 illustrates an embodiment corresponding to the memory cell of FIG. 1C or FIG. 1B, employing a polycrystalline silicon SBD. For the memory cell of FIG. 1C, the shape and impurity concentration of an n+ polycrystalline silicon layer 27 is decided suitably (if necessary, the impurity concentration is changed locally) to connect a resistance in series to the SBD. On the other hand, a polycrystalline silicon layer 31 is formed to connect a resistance in parallel to the SBD. One end of the polycrystalline silicon layer 31 is connected through a polycrystalline silicon layer 33 to the bases of transistors Tr1 and Tr2, while the other end thereof is connected through a p+ polycrystalline silicon layer, not shown, to a word line 23 in the same manner as that shown in FIG. 15.

Figure 21:
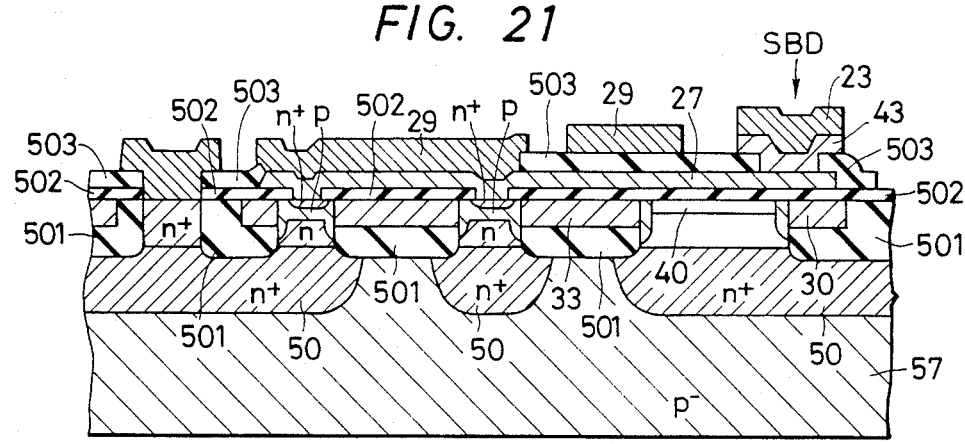

FIG. 21 illustrates an embodiment in which a resistance is formed by a p− single crystal silicon layer 40 instead of the polycrystalline silicon layer 31 employed in the embodiment of FIG. 20. The resistance is formed between a p+ polycrystalline silicon layers 30 and 33. The polycrystalline silicon layer 30 is connected to a word line 23. The mode of the connection is not shown.

Figure 22:
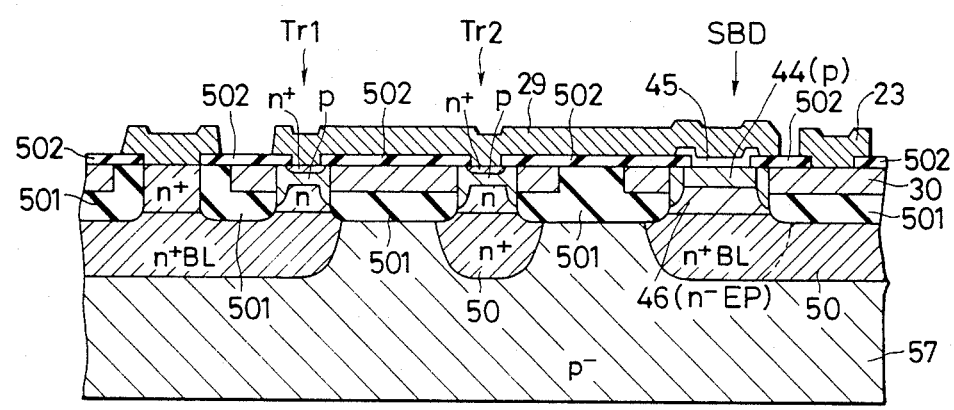

FIG. 22 illustrates an embodiment in which an SBD is formed between a p type silicon layer 44 and an electrode 45. The p type silicon layer 44 and the electrode 45 are the anode and cathode, respectively of the SBD. (Refer to J. M. Shannon, "Control of Schottky Barrier Height Using Highly Doped Surface Layers", Solid State Electronics, 1976, vol. 19, pp. 537–543, and J. M. Shannon, "Increasing the Effective Height of a Schottky Barrier Using Low Energy Ion Implantation", Applied Physics Letters, vol. 25, No. 1, 1 July, 1974, pp. 75–77.)

The p type silicon layer 44 is connected through a polycrystalline silicon layer 30 to a word line 23. The cathode 45 is connected through a metal layer 29 to the collectors of transistors Tr1 and Tr2.

Naturally, the cathode 45 may be connected to the collectors through an n+ polycrystalline silicon layer 27 as in the embodiment of FIG. 21.

Figure 23:
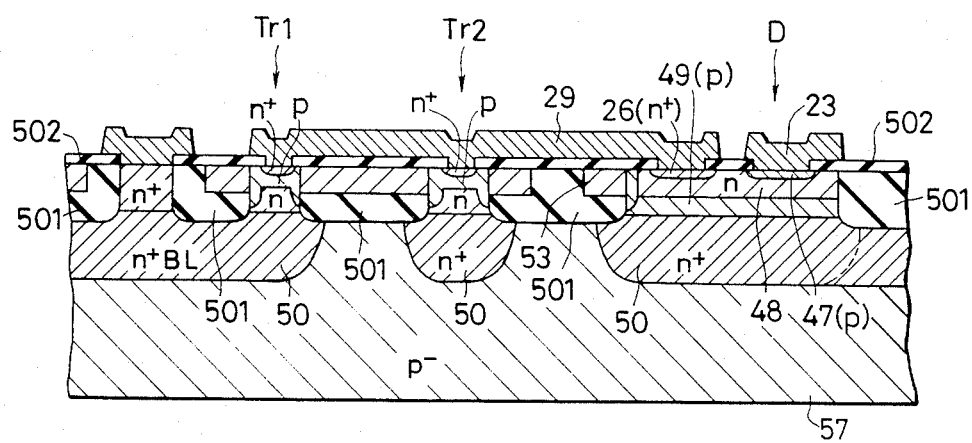

FIG. 23 is a sectional view of the memory cell of FIG. 1A. In FIG. 23, the resistances are not shown. The diode is formed across a p type region 47 and an n type region 48. The p type region 47, namely, the anode of the diode, is connected to the word line 23, while the n type region 48, namely, the cathode of the diode, is connected through an n+ contact region 26 and a metal layer 29 to the collectors of the transistors Tr1 and Tr2. Naturally, the metal layer 29 may be substituted by the n+ polycrystalline silicon layer employed in the embodiment of FIG. 21. This diode, similarly to the SBD of FIG. 10, is shielded from the noise current produced in the p− type substrate by a p type region 49 and an n+ BL 51. The region 49 and the n+ BL 51 are connected, similarly to the corresponding components of the embodiment of FIG. 10, to a conductor of a suitable potential to hold the connections between the n type region 48 and the p type region 49 and between the p type region 49 and the n+ BL 51 in reverse bias.

Figure 24:
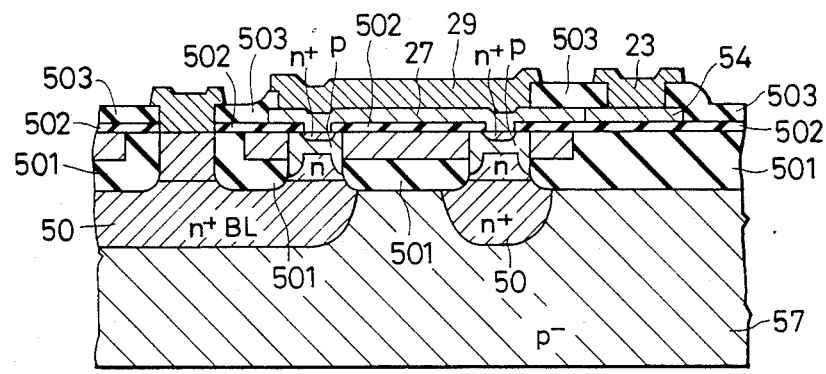

FIG. 24 illustrates a further embodiment in which a diode is formed across an n type polycrystalline silicon layer 27 and a p type polycrystalline silicon layer 54. In FIG. 24, the resistance is omitted for simplicity. Apparently, this memory cell is immune from alpha rays.

Figure 25:
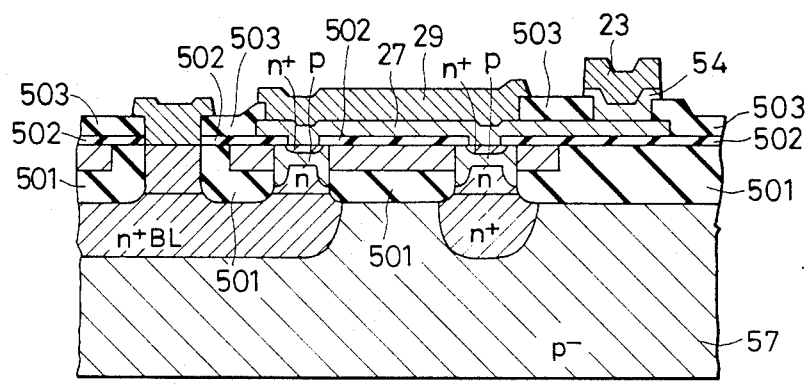

FIG. 25 illustrates a further embodiment of the memory cell of FIG. 1B. In this embodiment, a diode is formed across a p type polycrystalline silicon layer 54 and an n type polycrystalline silicon layer 27. The functions of this memory cell is similar to those of the memory cell of FIG. 24.

Figure 1E:
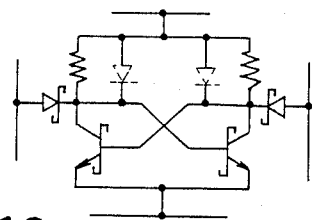

Although the embodiments of the memory cell of FIGS. 1A and 1E are not shown in the drawings, it is apparent from the foregoing description that the memory cells of FIG. 1A and 1E can be easily embodied similarly to those described hereinbefore.

It is obvious to those skilled in the art that memory cells of any type other than those illustrated in FIGS. 1A to 1E, such as a memory cell having only load resistances and a memory cell having, in combination, diodes and resistances, can be constructed through the combinations of the embodiments described hereinbefore.

As apparent from what has been described hereinbefore, the present invention provides device constructions which, basically, has high immunity from radiation. Particularly, the present invention has the remarkable effect of preventing soft error attributable to radiation such as alpha rays.

Figure 26:
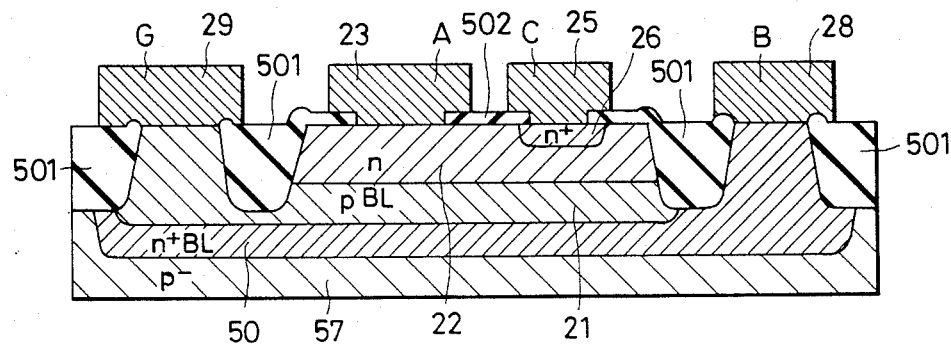

A modification having the highest immunity from alpha rays among the modifications of the second embodiment of the present invention will be described hereinafter with reference to FIG. 26. In this modification, an SBD is formed by an n type BL 50 and a p type BL 21 formed over the n type BL 50. The p type BL 21 is connected to an electrode 29 for external connection.

A Schottky barrier is formed at the junction of an n type epitaxial layer 22 and a metal electrode 23. A cathode 25 is in ohmic contact with a high-concentration n type region 26. The n type BL 50 is connected to a metal electrode 28 for external connection. A fixed voltage is applied through a metal electrode 28 to the n type BL 50. A fixed voltage is applied through a metal electrode 29 to the p type BL 21. In the SBD, forward current flows from the metal electrode 23 to the metal electrode 25 (from A to C in FIG. 26). The SBD and the substrate 57 are independent from each other in potential. Therefore, when a noise signal produced within the substrate is transmitted toward the SBD, the BLs 21 and 50 absorb the noise signal, and hence the potential of the SBD remains unchanged and the SBD is unaffected by the noise signal. Accordingly, the SBD is immune from the noise signal produced within the substrate.

Figure 27:
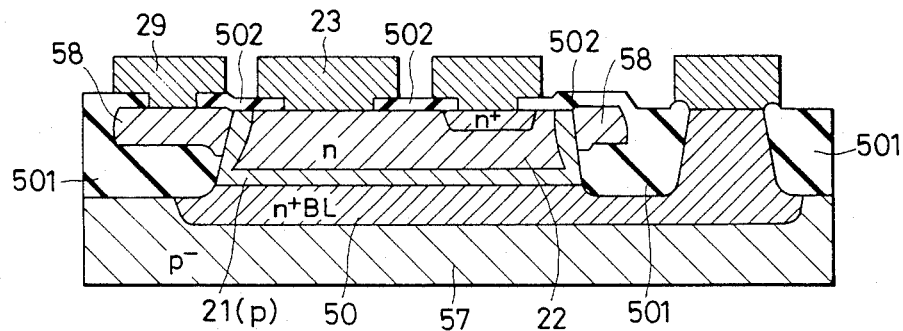

FIG. 27 is a sectional view showing the sectional construction of another embodiment of the present invention. In this embodiment, a polycrystalline silicon layer 58 is formed as an electrode for connecting a p type BL to an external circuit for the microminiaturization of the device. A basic construction of a transistor employing polycrystalline silicon layers is disclosed in Japanese Unexamined Patent Publication No. 56-1556. In this embodiment, an SBD is formed in a convex single crystal region and a polycrystal layer is formed in direct contact with the side wall of the convex single crystal region. The polycrystal layer is connected, as a p type conductive layer, to a p type BL 21. Thus, the area of the p type BL 21 is smaller than that of FIG. 26, which contributes to the microminiaturization of the device. Furthermore, since a polycrystal layer formed over a thick oxide film 501 is used as an electrode for external connection, the stay capacitance is reduced, which brings about low power consumption and high-speed operation of the device.

Figure 28A:
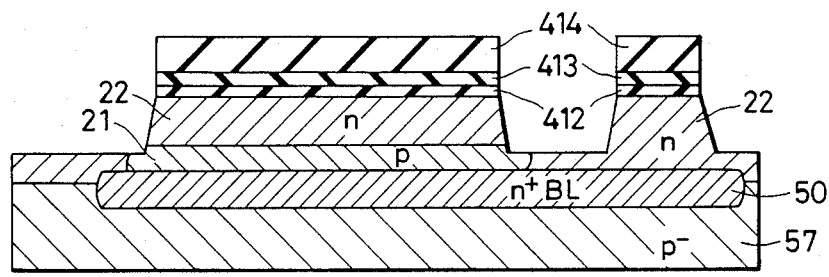
Figure 28B:
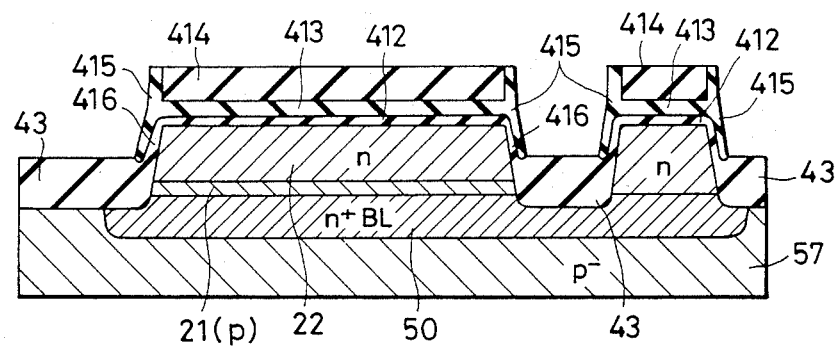
Figure 28C:
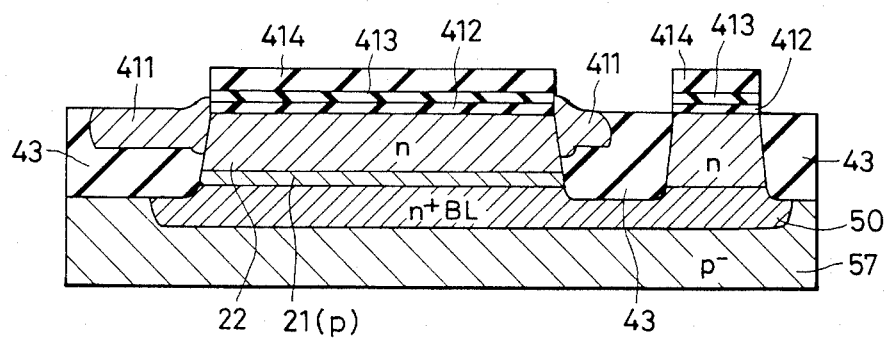
Figure 28D:
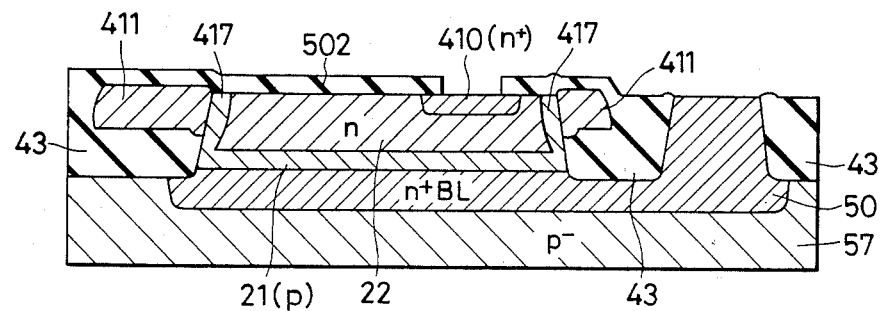
Figure 28E:
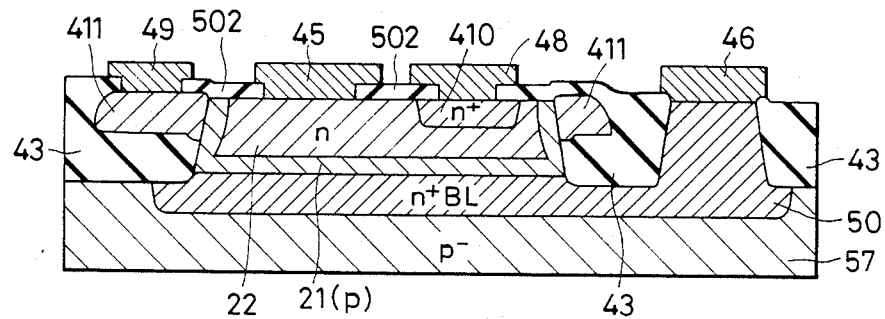

FIGS. 28A to 28E are sectional views showing the processes of manufacturing the SBD of the embodiment. A p type substrate 57 is subjected to n type diffusion and p type diffusion to deposit an n type epitaxial layer 22 thereon. The diffused layer includes an n type BL 50 and a p type BL 21. The impurity concentration of the n type epitaxial layer 22 is controlled through the ion implanting process or the like so that a preselected forward voltage $V_F$ appears. Then, an oxide film 412, a silicon nitride film 413 and an oxide film 414 are deposited one over the another on the epitaxial layer 22. Then, the epitaxial layer 22, the oxide film 412, the silicon nitride film 413 and the oxide film 414 are subjected to photoetching to form a convex region for forming an SBD and a convex region for reaching an n type BL as illustrated in FIG. 28A. After heat-oxidizing the entire area of the silicon surface layer to form an oxide film, a silicon nitride film is deposited over the oxide film. Then the silicon nitride film is subjected to the reactive sputter etching process employing $CF_4$ for unisotropical etching to form silicon nitride films 415 over the side walls of the convex regions. Then, this laminated structure is subjected to selective oxidation to coat the entire surface of the convex regions with a thick oxide film 43 as illustrated in FIG. 28B. Then, the silicon nitride films 415 and the oxide films 416 are removed from the side walls of the convex regions, a p type polycrystalline silicon layer is deposited and only the polycrystalline silicon layers deposited over the respective top surfaces of the convex regions are removed. Then, the entire surface of the polycrystalline silicon layer except the region for forming the SBD is oxidized to form a thick oxide film as shown in FIG. 28C. When the polycrystalline silicon layer 411 is oxidized, the p type impurity contained in the polycrystalline silicon layer diffuses into the convex single crystal layer to form a p type region 417 which is joined to the p type BL 21. A hole is formed in the oxide film formed over the surface of the convex region and an n type impurity is diffused into the n type epitaxial layer 22 to form an n type layer 410 having a high impurity concentration as shown in FIG. 28D. Holes are formed in the oxide films formed over the polycrystalline silicon layer 411 and the convex region and in the n type BL connecting region, metal electrodes are deposited through evaporation, and then the laminated structure is subjected to photolithographic process for patterning so that an SBD construction as illustrated in FIG. 28E is obtained.

Figure 29:
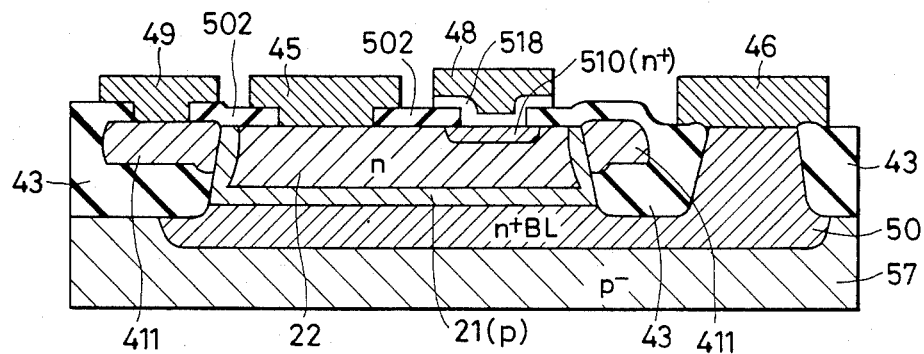

FIG. 29 illustrates the sectional construction of a fourth embodiment of the present invention. This embodiment has a polycrystalline silicon layer 518 to form a thin n type region 510 having a high impurity concentration through ion implantation. The polycrystalline silicon layer 518 is formed to prevent crystal defect due to the alloying of a metal electrode 48 and a convex single crystal layer.

Figure 30:
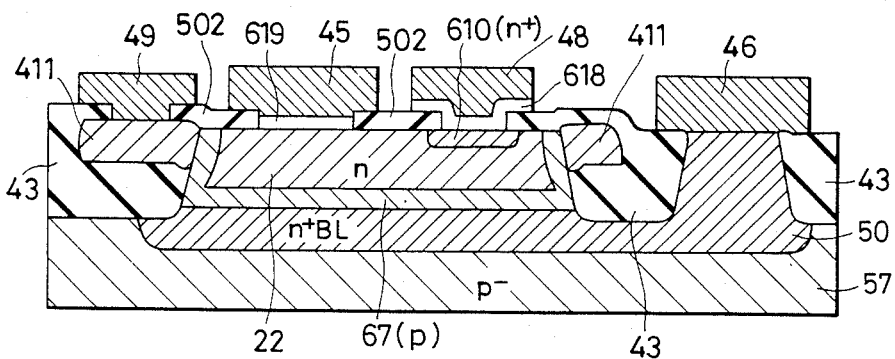

FIG. 30 illustrates the sectional construction of a fifth embodiment of the present invention. In this embodiment, a metal silicide layer 619 is formed between an n type epitaxial layer 22 and a metal electrode 45 to enable the precision control of the threshold voltage. Applicable metal silicides are tungsten silicide, platinum silicide, palladium silicide, and tantalum silicide and the like.

As described hereinbefore, according to the present invention, an n type BL and a p type BL are formed between an SBD and a substrate to isolate the SBD from the substrate so that the noise signal produced within the substrate will not affect the SBD. Accordingly, the present invention provides a very high density integrated SBD.

Naturally, the effect of the present invention remains unchanged even if the p type and the n type are inverted.

Figure 31:
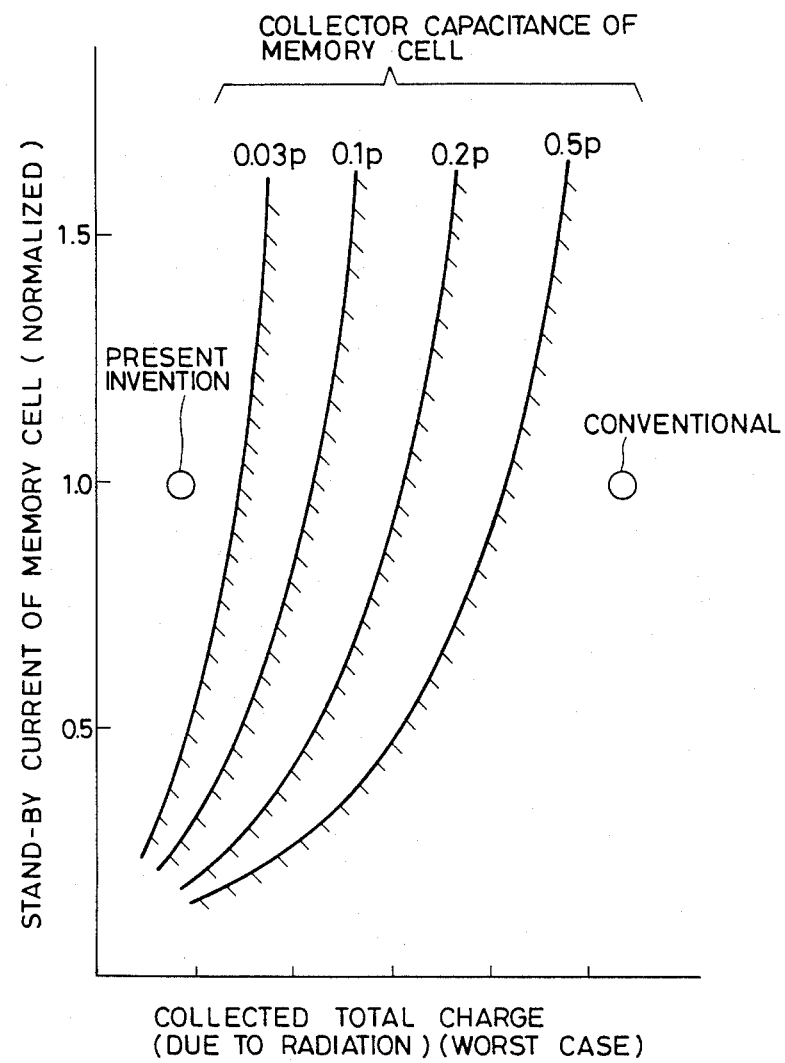

FIG. 31 is a graph of assistance in explaining the effect of isolating the load and the coupling device from the substrate according to the present invention on the improvement of the immunity of the memory cell from radiation.

Figure 4A:
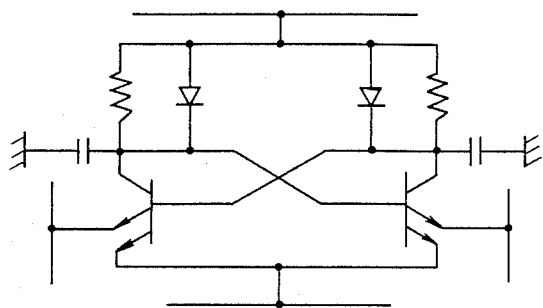
Figure 4B:
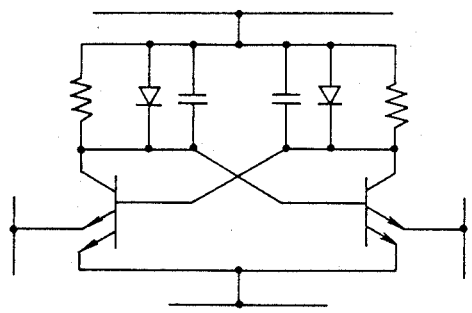
Figure 4C:
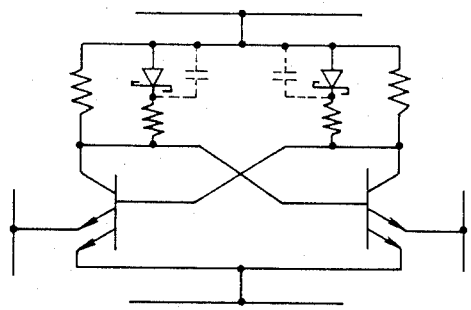

As apparent from FIG. 31, when a prior art memory cell, for example, the memory cell of FIG. 4B, is exposed to the worst radiation noise current condition, soft error occurs in the memory cell even when the collector of the memory cell is provided with a capacitance of 0.5 pF, whereas the memory cell of the present invention (a memory cell equivalent to that of FIG. 8B) is immune from such a noise current and soft error does not occur therein even though the memory cell has only a natural parasitic capacitance the value of which is dependent on the layout thereof and is in the range of 0.03 to 0.05 pF.

Embodiment 3

Bipolar memory cells, in a third embodiment of the present invention, each provided with pnp transistors as loads, namely, so-called pnpn type memory cells, will be described hereinafter. The pnp transistors and npn transistors are inverted.

Also described herein is a bipolar memory cell having load pnp transistors provided with shields, respectively, to prevent the intrusion of electrons from the substrate into the device.

Examples of the third embodiment have a higher density of integration than that of the second embodiment.

Figure 32A:
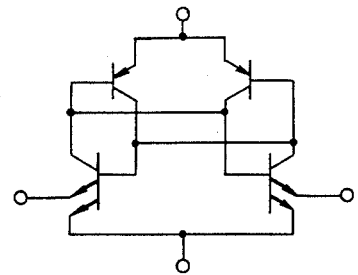
FIGS. 32A through 47 are illustrations useful for explaining constructions of memory cells employing shield pnp transistors as loads, respectively.
Figure 32C:
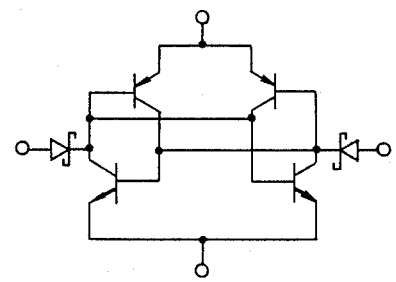
Figure 32B:
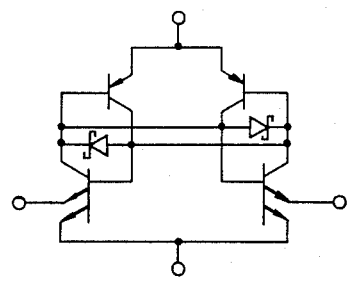
Figure 32D:
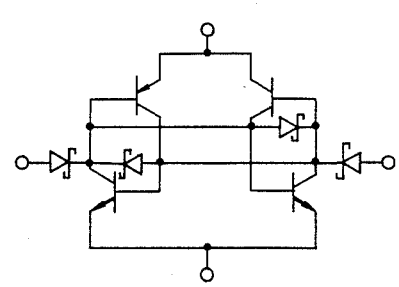
Figure 33:
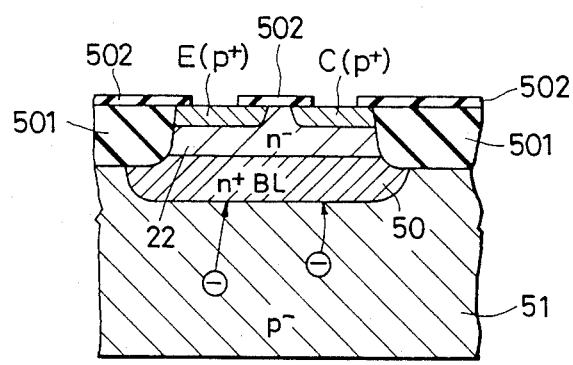

FIGS. 32A to 32D illustrate memory cells having cross-connected pnpn switches (thyristors) each consisting of a pnp transistor and an npn transistor. According to the present invention, the npn transistor is inverted. According to the prior art, when a forward npn transistor is employed, a lateral transistor as illustrated in FIG. 33 is employed to construct a compact memory cell. Naturally, such a pnp transistor may be employed in the present invention. Since the radiation noise current does not flow in the collector of the npn transistor, the employment of such a pnp transistor improves the immunity from radiation of the memory cell accordingly. However, since the noise current flows toward the base of the pnp transistor and, finally, flows into the collector node of the memory cell, it is possible that soft error occurs. That is, since part of the base of the pnp transistor (lateral pnp transistor) of the conventional memory cell is an n+ BL, the electrons gathered in the n+ BL (pnp base) finally gather in the collector node of the npn transistor (pnp base is connected to the npn collector), it is impossible to enhance the immunity from radiation remarkably when only the npn transistor is inverted. Naturally, the immunity from radiation is improved by a degree corresponding to the reduction of the amount of electrons that gather in the collector of the npn transistor. Accordingly, it is desirable that the pnp transistor is shielded from the noise current produced in the substrate by radiation. The pnp transistor having such a construction will be described afterward. When a pnp transistor isolated from the substrate is employed, a noise current is produced only by the electric charge produced only within the active area (npn and pnp transistor regions) and the intensity of the noise current is, similarly to the memory cells of FIGS. 8A to 8F employing loads and coupling devices which are shielded from the substrate, at the worst, approximately one-tenth of the intensity of the noise current produced within the substrate. FIGS. 32B to 32D illustrates modifications of the memory cell of FIG. 32A. The memory cells of FIGS. 32B to 32D employ SBDs. Naturally, it is desirable that the SBDs are shielded, as those of FIGS. 8A to 8F, from the substrate so that the electric charge produced by radiation will not affect the SBDs.

This embodiment is a cross-connection pnpn memory cell having a construction in which the npn transistor is inverted and the gathering of electric charge produced within the substrate in the base (connected to the collector of the npn transistor) and the collector (connected to the base of the npn transistor) of the pnp transistor.

Figure 1F:
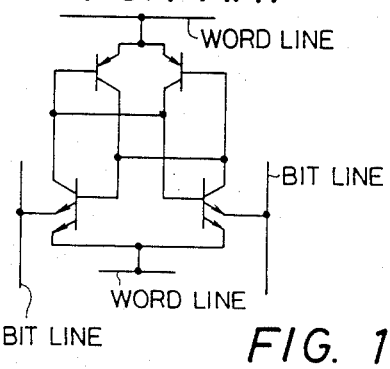
Figure 34:
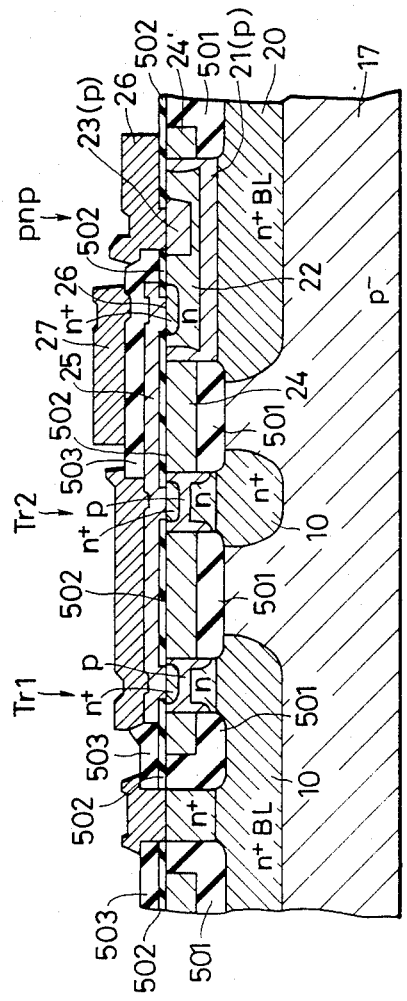
Figure 35:
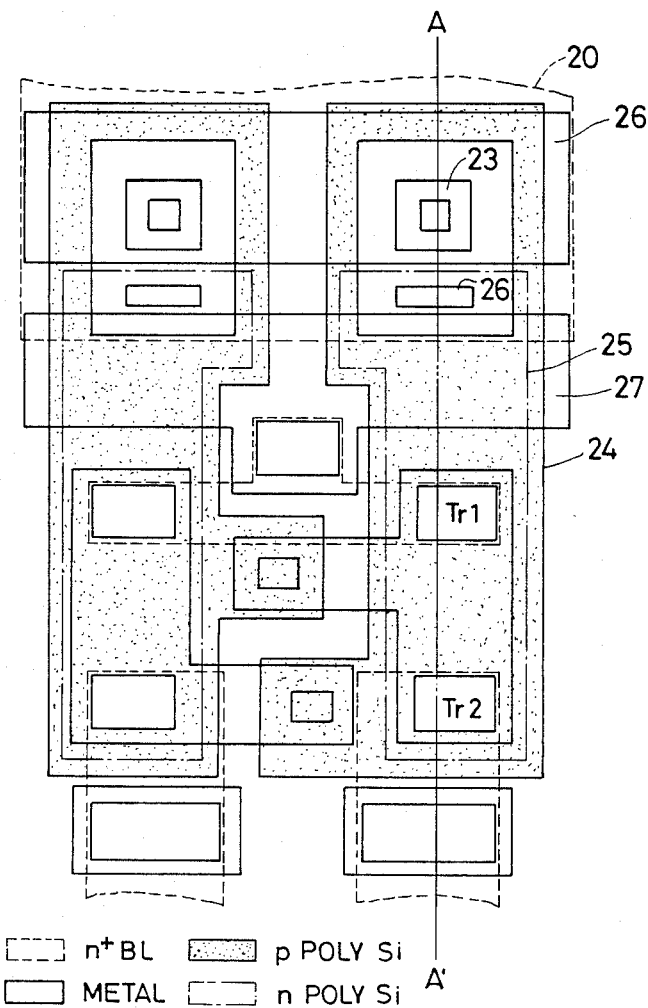

FIGS. 34 and 35 are sectional view and a plan view, respectively, of a memory cell corresponding to that of FIG. 1F. As mentioned above, npn transistors Tr1 and Tr2 are inverted and n+ BLs 10 and 10' serve as emitters, respectively. A pnp transistor consists of a p type emitter region 23, an n type base region 22 and a p type collector region 21, and functions as a vertical pnp transistor. An n+ BL 20 is connected to a power source which always keeps the junction potential between the n+ BL 20 and the collector region 21 in reverse bias. Accordingly, the electric charge gathered in the n+ BL 20 is grounded through the power source and does not reach the base or the collector of the pnp transistor. Therefore, the combination of the inverted npn transistors and this pnp transistor prevents the electric charge produced within the substrate due to radiation from gathering in the collector node of the memory cell, so that the immunity of the memory cell from soft error attributable to the incidence of radiation is enhanced remarkably. The base of the pnp transistor is connected through an n+ BL 26 and an n+ type polycrystalline silicon layer 25 to the collectors of the npn transistors Tr1 and Tr2, however, this connection may be made by other means, such as an aluminium wiring. The lead of the collector of the pnp transistor, p type polycrystalline silicon layers 24 and 24' surrounds the n type base region as shown in FIG. 35. The p type polycrystalline silicon layers 24 and 24' are the same. The emitter region 23 is connected to an upper word line 26.

The layout of the memory cell of FIG. 34 is shown in FIG. 35. FIG. 34 is a sectional view taken along line A-A' of FIG. 35. As illustrated in FIG. 35, the right-hand and left-hand transistors of the memory cell are interconnected in cross connection through the connection of metal electrodes extended to an isolation region between the transistors from the right and left sides thereof and the p type polycrystalline silicon layer.

Figure 36:
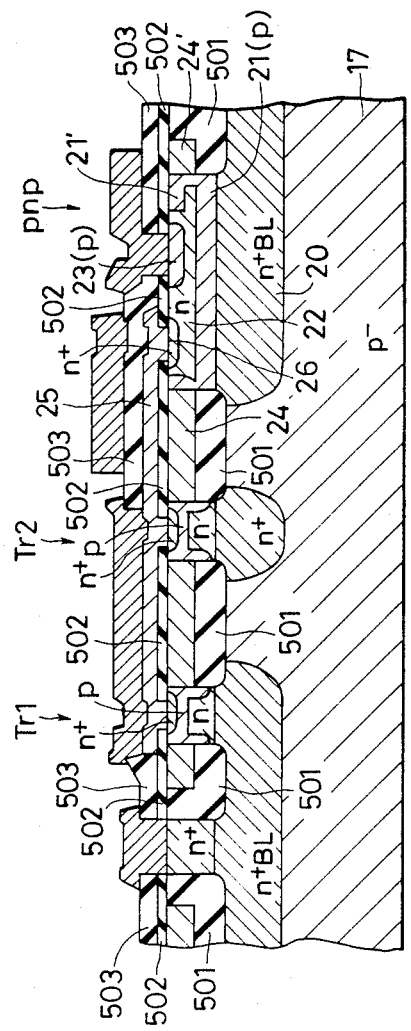
Figure 37:
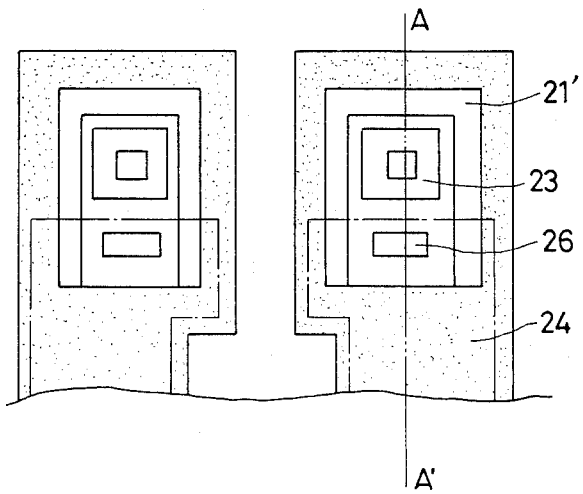

A memory cell illustrated in FIG. 37 has a pnp transistor expected to function as a lateral pnp transistor. As illustrated in FIG. 37, a collector region 21' is formed so as to surround a p type emitter region 23, except that only one side thereof is open to lead out a base contact 26. Generally, when a vertical pnp transistor is formed, as illustrated in FIG. 34, it is difficult to control the base width between the p type collector region formed directly above the n+ BL and the p type emitter region 23, and hence it is difficult to control the characteristics of the vertical pnp transistor. On the other hand, when a lateral pnp transistor is formed as illustrated in FIG. 6, since the width of the base region between the p type collector region 21' and the p type emitter region 23 is defined with a photomask, the characteristics of the lateral pnp transistor can be comparatively easily controlled. Furthermore, in the memory cell of FIG. 36, the pnp transistor functions mainly as a lateral transistor, however, the same is able to function also as a vertical pnp transistor and the npn transistor may function as both vertical and lateral pnp transistors or may function principally as a vertical pnp transistor and subordinately as a lateral pnp transistor.

Figure 1G:
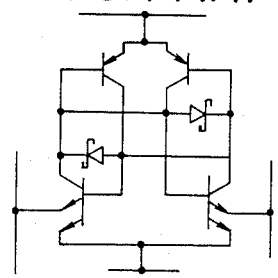
Figure 1H:
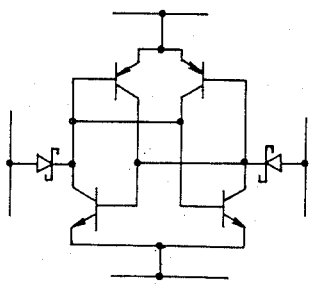
Figure 38A:
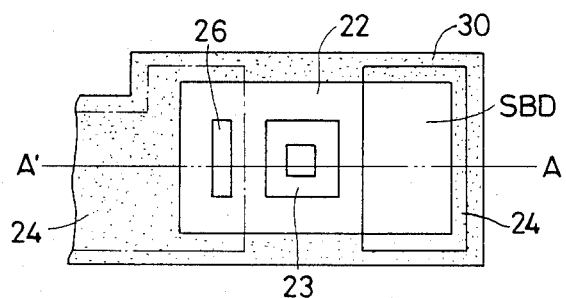
Figure 38B:
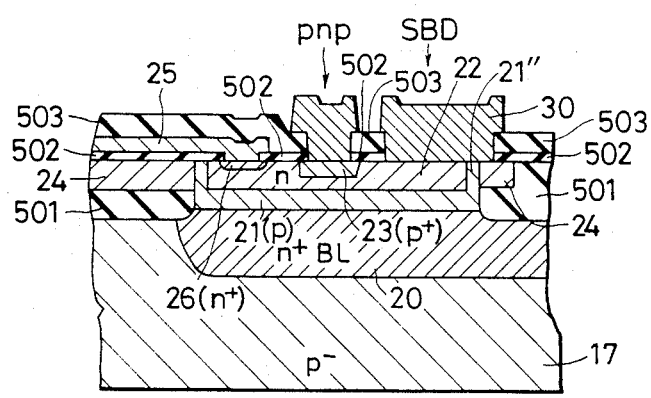

FIGS. 38A and 38B illustrate a memory cell, in which an SBD for the memory cell of FIG. 1G or 1H is provided between the n type base region 22 of a pnp transistor and a metal electrode 30. In this embodiment, the SBD is inserted between a polycrystalline silicon layer 24' and the n type base region 22, which is suitably applicable to the memory cell of FIG. 1G. When the SBD is applied to the memory cell of FIG. 1H, the anode of the SBD is disconnected from the collector of the pnp transistor. Concretely, the size of the contact hole of the SBD is reduced so that an electrode 30 will not be in contact with the polycrystalline silicon layer 24' and a p type silicon region 21". In order to provide the SBD with desired characteristics, the impurity concentration of the n type base region 22 may be varied from portion to portion so that the impurity concentration of a portion below the electrode 30 and that of a portion below the p+ type emitter region 23 are different from each other. When such an impurity concentration distribution is desired, the impurity is implanted individually into the portion below the electrode of the SBD and the portion below the emitter of the pnp transistor through ion implantation.

Figure 39A:
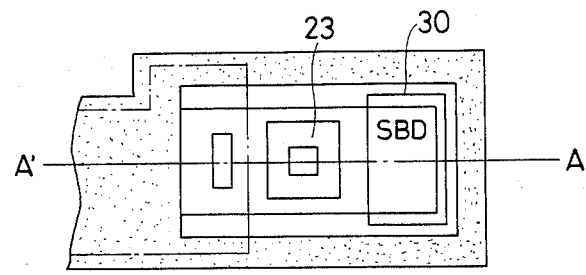
Figure 39B:
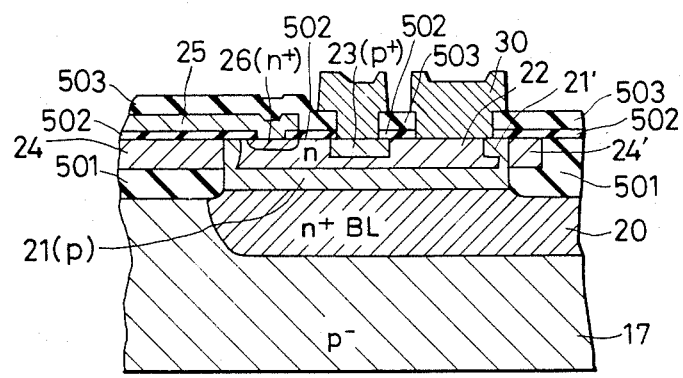

FIGS. 39A and 39B illustrate a memory cell in which an SBD is connected to the base and collector of a pnp transistor which functions principally as a lateral pnp transistor as that of FIGS. 36 and 37. In this memory cell, the anode of the SBD and the collector of a pnp transistor are connected to a p type region 21', however, the size of the contact hole 30 of the SBD may be increased to connect the anode of the SBD and the collector of the pnp transistor to a p type polycrystalline silicon layer as well as to the p type region 21'. On the contrary, when the size of the contact hole 30 is reduced to disconnect the anode of the SBD from the p type polycrystalline silicon layer, the SBD is applicable to the memory cell of FIG. 1H as that of the SBD of the memory cell of FIGS. 38A and 38B. The SBDs of the memory cells of FIGS. 38A, 38B, 39A and 39B are shielded with n+ BLs connected to a power source, and hence the noise current produced within the p− substrate by radiation does not flow into the anode and cathode of each SBD. Thus the addition of the SBD improves the immunity of the memory cell from radiation remarkably.

Figure 1I:
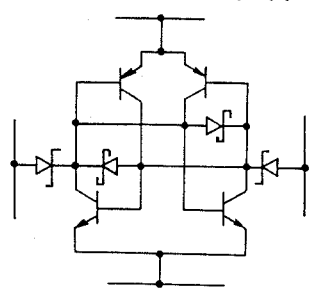
Figure 2:
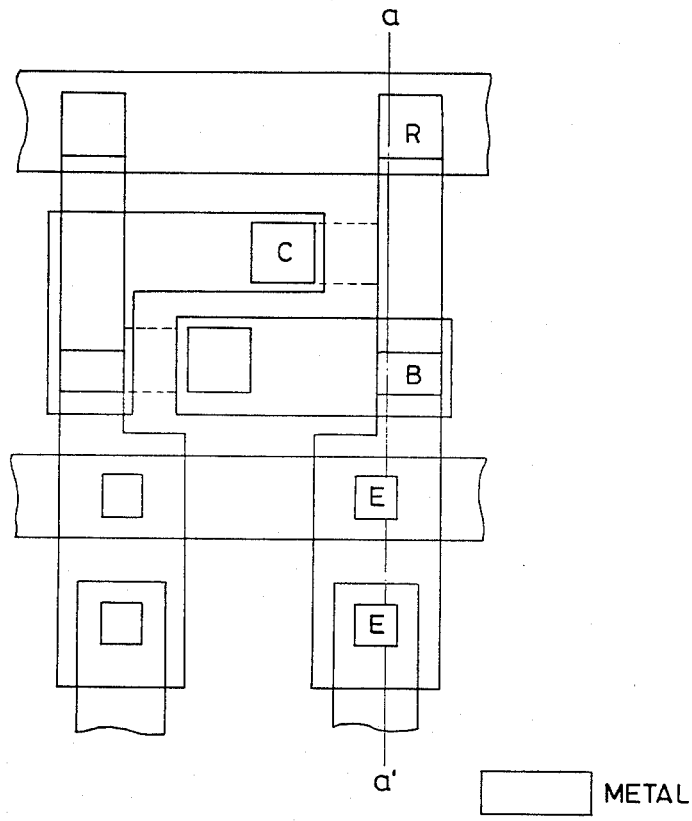
Figure 40:
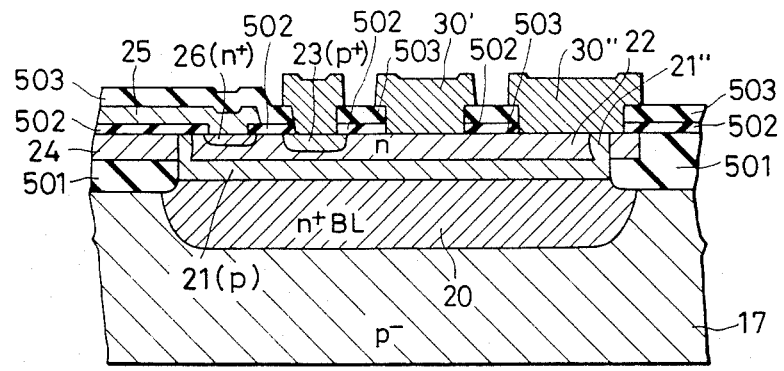

FIG. 40 illustrates a memory cell equivalent to that of FIG. 1I, in which two SBDs 30' and 30" are formed in the base region 22 of a pnp transistor. The SBD 30' is connected to a bit line, while the SBD 30" is used for preventing the saturation of the memory cell transistor and the anode thereof is connected to a p type collector region. In the memory cell of FIG. 40, a base contact 26, an emitter 23, the SBD 30' and the SBD 30" are arranged in a line in this order, however, they are not necessarily arranged neither in that order nor in a line and their relative positions are optional depending on the layout of the memory cell.

Figure 41:
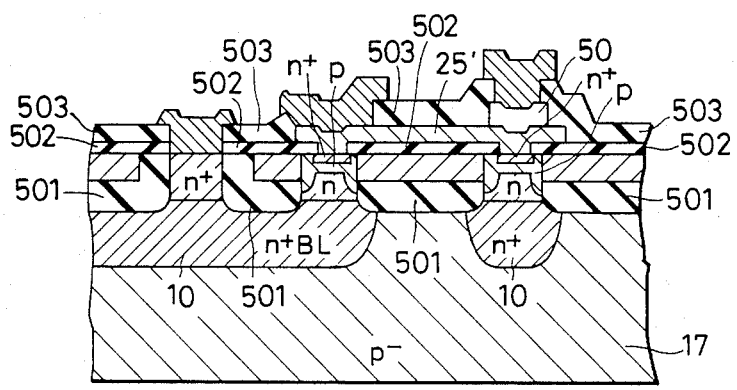

Embodiments in which a pnp transistor is formed in a silicon substrate has been described hereinbefore, however, it is possible to form a pnp transistor outside a silicon substrate through the most advanced manufacturing technique. FIG. 41 illustrates a memory cell in which a pnp transistor is formed outside a silicon substrate. In this memory cell, the polycrystalline silicon layer 25 employed in the memory cell of FIG. 34 is processed with a laser ray or the like to form an n type single crystal silicon layer 25', a p type single crystal silicon layer 50 is formed on the n type layer 25' and the n type layer 25' is coupled with an npn transistor formed below the n type layer 25' to construct a pnpn transistor. Since the pnp transistor of this memory cell is formed above the substrate, the pnp transistor is not affected by a noise current produced within the substrate. In this memory cell, the collector and base regions of the npn transistor serves also as part of the base and the collector of the pnp transistor. However, it is also possible to form the pnp transistor above the substrate. It is apparent to those skilled in the art that the present invention is applicable to various memory cells employing various pnp transistors formed over the substrate, respectively.

As described hereinbefore, combining inverted npn transistors and a shield pnp transistor almost completely prevents the accumulation of the radiation noise charge in the collector node or the base node of the memory cell. Thus the present invention enhances the immunity of the memory cell from radiation remarkably without providing any capacitance and provides a compact memory cell.

The construction and a process for manufacturing the shield pnp transistor employed in the above-mentioned memory cell will be described hereinafter with reference to FIGS. 42 and 43A to 43D.

Figure 42:
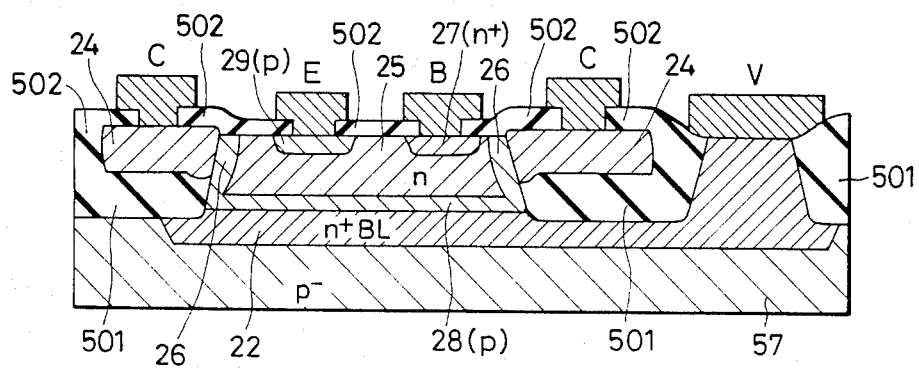

Referring to FIG. 42, a p type buried layer 28 is formed over an n type buried layer 22. The p type buried layer 28 is connected to a p type region 26 formed by diffusion through a p type polycrystalline silicon layer 24 formed over a buried oxide film 501 to form a collector region. A metal layer C is a collector electrode formed in contact with the polycrystalline silicon layer 24. An n type layer 25 surrounded by the collector region is a base region. A base electrode B is formed on an n type layer 27 having a high impurity concentration formed within the base region. A p type region 29 is an emitter region which is formed by diffusion through the surface of the substrate.

In this embodiment, the emitter region 29, the base region 25 and the collector region 28 constitute a vertical pnp transistor. Since the emitter region is formed by diffusion through the surface of the substrate, and hence the gap between the emitter region and the collector region can be easily adjusted by appropriately adjusting the duration of the diffusion process, the width of the base can be easily adjusted. Since the base electrode B is formed near the emitter electrode E within the same single crystal silicon layer, the parasitic capacitance of the base is small as compared with that of the conventional construction. The n type buried layer 22 is connected to an electrode V; and the substrate 57 and the vertical transistor can be electrically isolated from each other by applying a fixed voltage to the electrode V. That is, the n type buried layer 22 is electrically shielded from the vertical transistor.

Thus, the width of the base can be easily adjusted, the base has a small parasitic capacitance and the noise signal produced within the substrate is absorbed by the n type buried layer.

A process for manufacturing the shield pnp transistor described with reference to FIG. 42 will be described hereinafter with reference to FIGS. 43A to 43D.

Figure 43A:
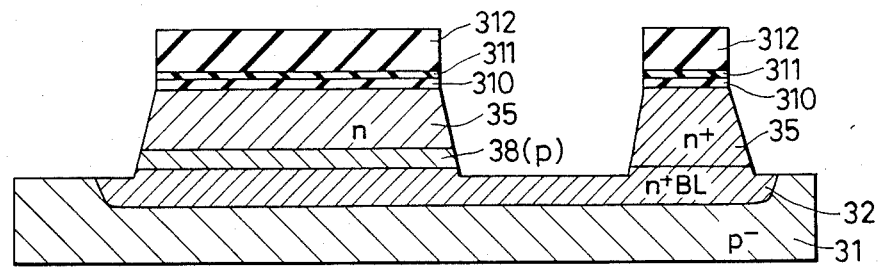
Figure 43B:
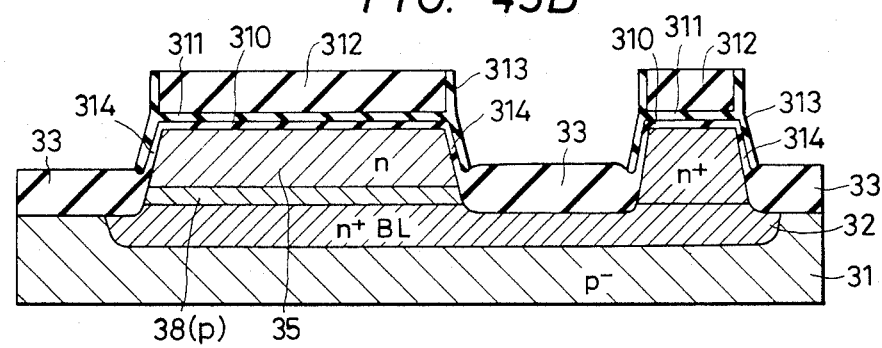
Figure 43C:
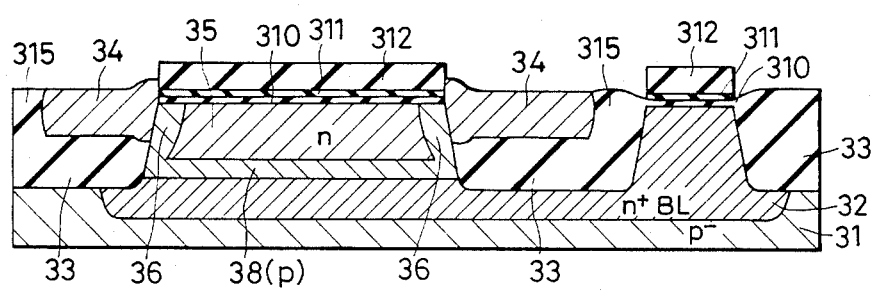
Figure 43D:
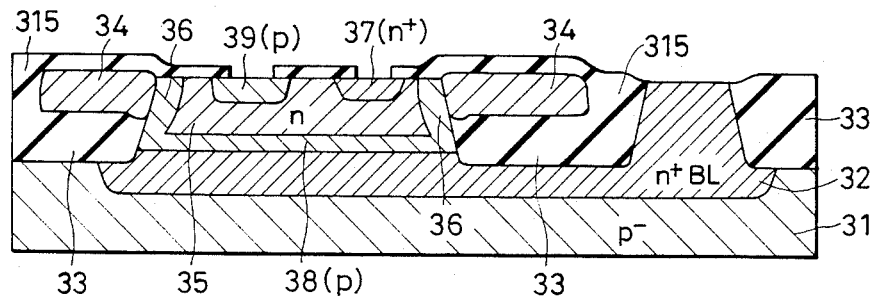

An n type layer 32 is formed over a p type substrate 31, and then a p type layer 38 is formed in a desired region through the ion implantation process. An n type epitaxial layer 35 is deposited over the p type layer 38 and the n type layer 32, and then an oxide film 310, a silicon nitride film 311 and an oxide film 312 are formed over the n type epitaxial layer 35. Then, the laminated structure is subjected to an etching process to etch the layers of the films 310, 311 and 312 and the n type epitaxial layer 35, except a region for constituting a transistor and an n type buried layer connecting region as illustrated in FIG. 43A. Then, the laminated structure is subjected to a hot oxidation process. Then, a silicon nitride film is deposited over the entire surface of the laminated structure, and then the laminated structure is subjected to a reactive sputter etching process for unisotropical etching to form a thick oxide films 33 over the entire surface of the laminated structure except the silicon nitride films 313 surrounding the convex single crystal regions as illustrated in FIG. 43B. Then, the silicon nitride film 313 and the oxide film 314 formed over the side walls of the convex single crystal regions are removed, then a p type polycrystalline silicon layer 34 is deposited, then only the p type polycrystalline silicon layer 34 deposited on top of the convex single crystal regions is removed, then the p type polycrystalline silicon layer except a portion which is to be used as a transistor region is oxidized to form a layer 315. During the heat process, part of the impurity contained in the polycrystalline silicon layer is diffused into the n type single crystal layer 35 to form a p type region 36 which connects the p type buried layer 38 to the p type polycrystalline silicon layer 34 as illustrated in FIG. 43C. Then, the oxide film 312 is removed and the surface layer of the p type polycrystalline silicon layer 34 is oxidized, and then the silicon nitride film 311 is removed. Then, a p type emitter region 39 and an n type region 37 having a high impurity concentration are formed in the n type single crystal layer 35 through diffusion. Contact holes are formed in the layer 315 at positions corresponding to the p type emitter region 39 and the n type region 37, respectively (FIG. 43D), and electrodes are formed in the contact holes. Thus the pnp transistor of FIG. 42 is completed.

Figure 44:
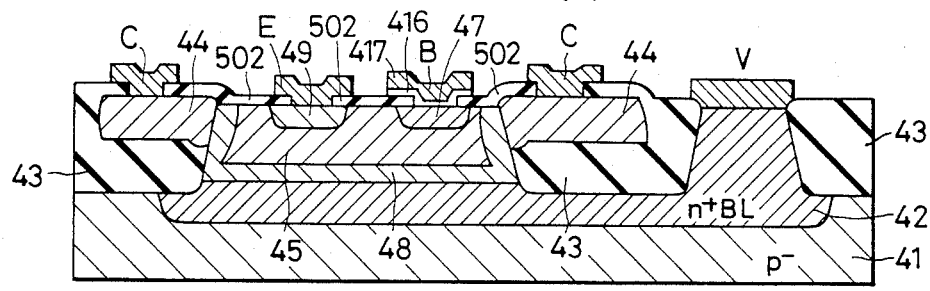

FIG. 44 illustrates a further transistor embodying the present invention. In this transistor, a buffer layer 416 is formed over an n type base connecting region 47 having a high impurity concentration to obviate the direct reaction between a metal electrode 417 and a single crystal silicon region. The buffer layer is a polycrystalline silicon layer or a metal silicide. Such a buffer layer is necessary when the depth of diffusion of the n type base connecting region 47 is very shallow.

Figure 45:
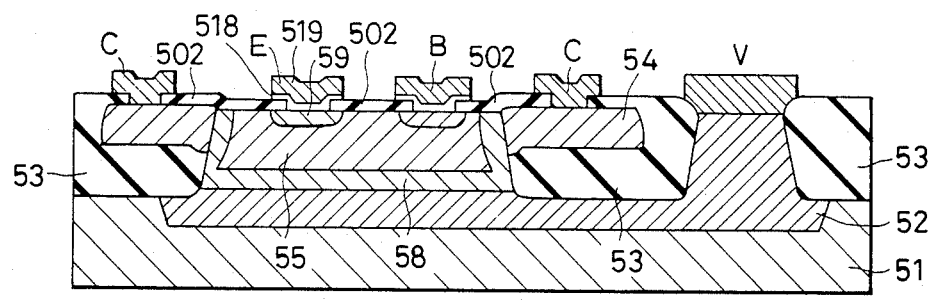

FIG. 45 illustrates another transistor embodying the present invention. In this embodiment, a buffer region is formed between a p type emitter region 59 and a metal electrode 519. When the epitaxial layer is thin and the depth of diffusion of the emitter needs to be shallow, a buffer layer 518 is necessary to prevent the anomalous diffusion of the impurity due to the alloying of the single crystal silicon layer with a metal and to prevent the accidental short-circuiting between the emitter and the base due to the separation of metal.

Figure 46:
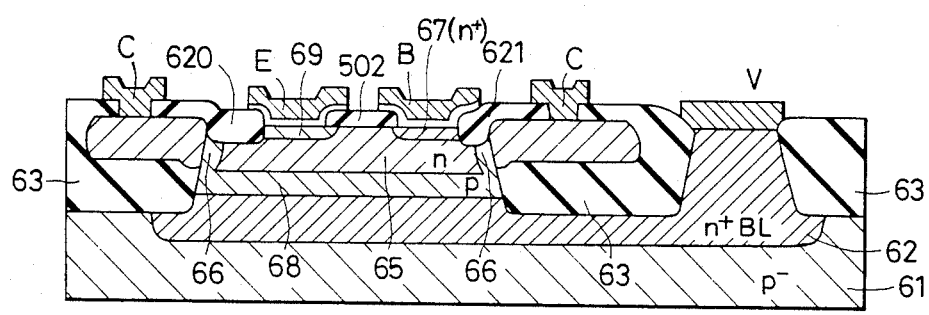

FIG. 46 illustrates a further transistor embodying the present invention. In this embodiment, a part of the circumference of an emitter region 69 and a part of the circumference of a base connecting region 67 having a high impurity concentration are in direct contact with oxide films 620 and 621, respectively, to microminiaturize the device and to reduce the parasitic capacitance. Since the emitter region 69 and the base connecting region 67 are separated from a p type region 66 by oxide films, respectively, both the size and the parasitic capacitance of the device are reduced approximately by 80% as compared with those of the above-mentioned embodiment.

Figure 47:
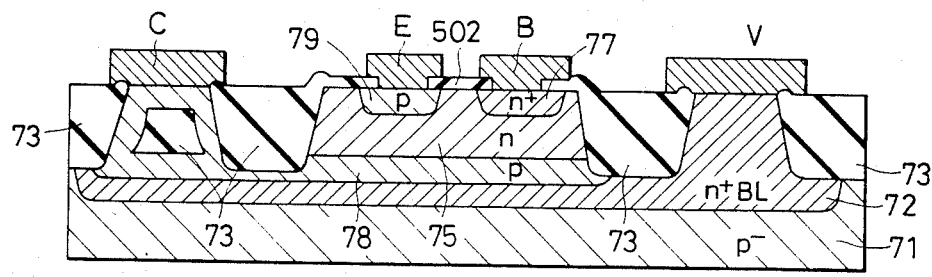

FIG. 47 illustrates a still further embodiment of the present invention. In this embodiment, the collector region is not led out through a polycrystalline silicon layer formed over the side surface of a convex single crystal silicon region. The collector region is led out through a metal electrode formed on top of a separate land connected to the extension of a p type buried layer 78 forming the collector region. Since any polycrystalline silicon layer need not to be formed in this embodiment, the manufacturing process is simplified.

A further embodiment of the present invention will now be described below.

Figure 48A:
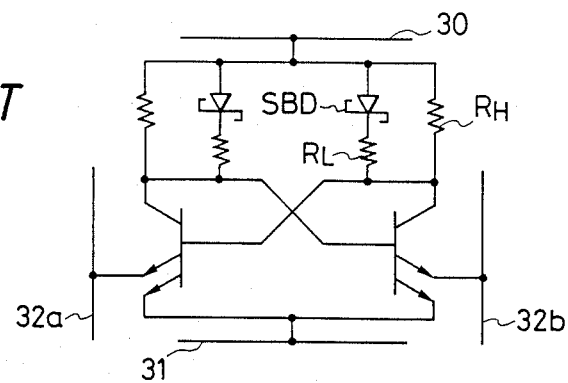
FIGS. 48 through 60 are illustrations useful for explaining other embodiments of the present invention.
Figure 48B:
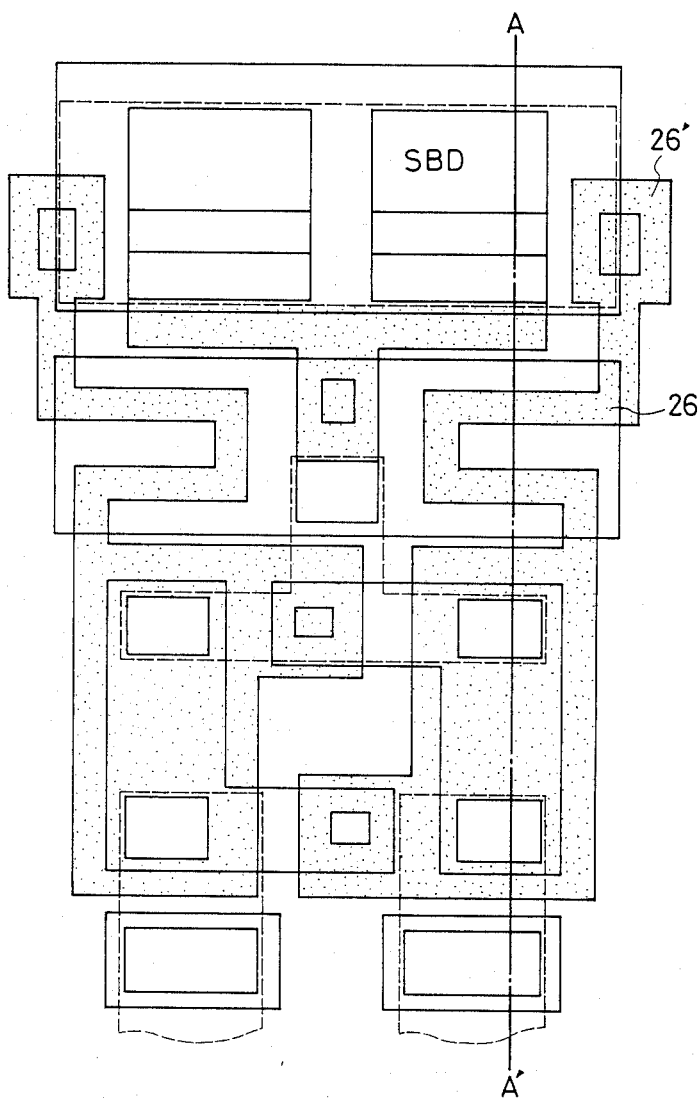
Figure 49:
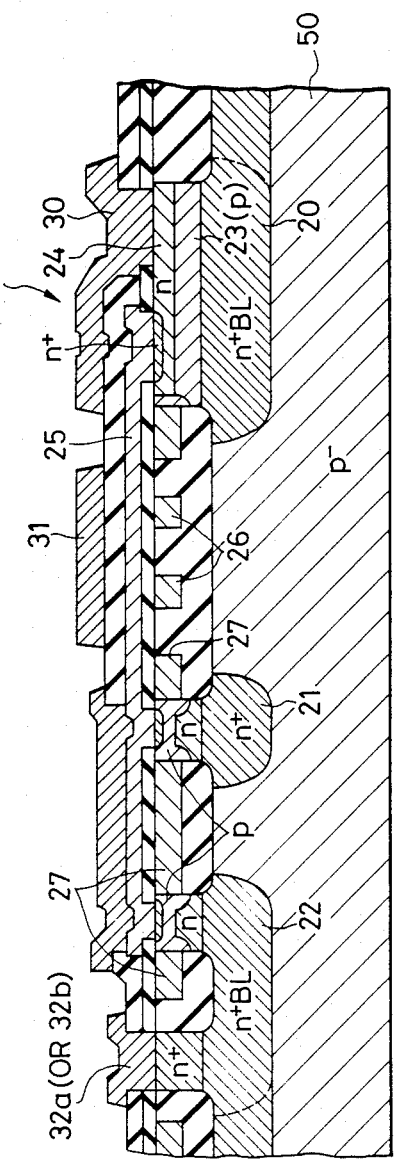

FIG. 47A shows a circuit diagram of the highest-speed memory cell known at present (ISSCC Digest of Technical Papers, 1977, pp. 108–109). In this memory cell, improvement of the immunity from soft error arising from incidence of radiations requires a capacitor to be connected in parallel with the SBD (alternatively, the SBD may be enlarged in area so that it provides the required capacitance), resulting in an increase in the memory cell area. On the other hand, the memory cell of the embodiment described above is a memory cell freed from the thus mentioned drawback and improved, on an intrinsic basis, in the immunity from soft error. This memory cell comprises a combination of an upward operation type transistor and a shield type Schottky barrier diode (hereinafter abbreviated to "SBD"). FIGS. 48B and 49 are a plan view and a cross-sectional view of the memory cell, respectively. In general, of the electron-hole pairs produced in a substrate 50 by the incidence of radiation (e.g., alpha rays), the electrons collect in an n+ buried layer, causing soft error. In the memory cell of this construction, however, the n+ buried layers (the emitter layers 21, 22 of transistors and the shield n+ BL layer 20 of the shield type SBD) are connected respectively to a (lower) word line (31 in FIG. 49), a bit line (32a or 32b in FIG. 49) and an appropriate power source or word line 30 or the like. On the other hand, a p layer 23 is connected to an appropriate potential (e.g., the lower word line 31) such that each of the junctions with an n layer 20 and an n layer 24 shows reverse bias. The SBD is formed between an electrode 30 (upper word line) and an n layer 24, a resistor $R_L$ with low resistance is constituted of the resistance of the n layer 24 itself), and is connected to the collectors of the transistors by a conductor layer 25 (an Al electrode, silicidized polycrystalline silicon or a polycrystalline silicon layer with high impurity concentration). A resistor $R_H$, in this embodiment, is constituted of a polycrystalline silicon 26 having a high resistivity and connected between the word line 31 and a p type polycrystalline silicon 27 for base contact. The resistor $R_H$, may be formed by other arbitrary method.

In the shield type SBD construction according to the embodiment described above, it is difficult to provide the n layer 24 with low resistance. That is, in order to produce a high-performance transistor, it is necessary to form a shallow junction, and the thickness of the epitaxial layer, or the total thickness of the n layer 24 and the p layer 23, must be small. The p layer 23 may be formed by a method wherein p+ is previously buried before or after formation of an n+ buried layer and is caused to diffuse upward from the buried layer at the time of formation of an n epitaxial (thereby forming a p+ buried layer), a method wherein p type impurities are implanted with high energy after the formation of the epitaxial layer, or the like method. Regardless of which one of these methods and other methods is used, a considerable portion of the epitaxial layer becomes p layer, so that the resistivity of the n layer is considerably high (several K$\Omega$/□ when the epitaxial layer is produced by the present-day standard process). Because the thickness of the epitaxial layer will be reduced in the future with the trend toward shallower junctions for higher performance, there is a possibility of the resistance of the n layer becoming higher in the future, and it is difficult to reduce the resistance. Incidentally, the resistance of the n layer is a series resistor (part of $R_L$ in FIG. 48A) for the SBD, and it is therefore necessary to set the resistance to or below 100–200 $\Omega$ in order to pass an operating current of several milliamperes for high-speed operation of the memory cell. Because of the above-mentioned high resistivity, the resistance of the n layer ordinarily cannot be reduced far below about 1 K$\Omega$. Although the resistance can be naturally reduced by greatly increasing the width of the SBD in FIG. 48B, such a method leads to a very large memory cell area and, accordingly, is not practical.

Thus, where the resistance in series with the SBD is high, a large read current cannot be obtained, and a high-speed memory cannot be realized.

The above description relates to a memory cell in which upward transistors and shield type SBDs are used. With the conventional memory cell using downward transistors, also, a smaller SBD has come to be contrived by using a capacitance (e.g., a capacitance utilizing the side walls of a hole provided in silicon or utilizing a high dielectric such as $Ta_2O_5$) exclusively as a capacitor which acts against soft error, in order to reduce the cell area. In such a case, the reduction in the area of the SBD is accompanied by an increase in the series resistor, and, again, it is impossible to operate the memory cells with a large current, and a high-speed memory cannot be realized.

In order that a large read current of several milliamperes can flow even where the resistance of the series resistor for the SBD is as high as several handred ohms to several kiloohms, a design may be adopted in which a clamping circuit is further provided in parallel with the memory load consisting of a parallel circuit of a high resistance with a series circuit of the SBD and a low resistance so that a large current is bypassed. With such a construction, a large read current can be passed and a higher-speed operation can be realized.

According to the present invention, a memory cell is provided which comprises a combination of downward transistors with SBDs or a combination of upward transistors with shield type SBDs, wherein a transistor is additionally provided in parallel with each load device of the memory cell. With this construction, even when a large read current is passed to the memory cell, a portion or major portion of the current is permitted to flow through the parallel transistor for the load, whereby the voltage of the memory cell is clamped and a substantially constant swing can be obtained. Therefore, a large read current of several milliamperes can be passed even where the series resistance for the SBD is considerably high (several kiloohms). Without the parallel transistor, the whole current flows through the series resistor for the SBD and the swing of the memory cell (the voltage dtop through the resistor) is as high as about 10 V (=several kiloohms×several milliamperes). This condition cannot be obtained in practice, because the memory cell transistor is saturated long before such a large swing appears. If the memory cell transistor is thus deeply saturated, read time and write time are prolonged, reducing the operation speed of the memory cell, and isolation between the memory cell and adjacent cell might be broken. Accordingly, where the series resistance for the SBD is high, it is impossible to enhance the operation speed by passing a large read current.

In short, where the series resistance for the SBD is high, high-speed reading is realized only after it is made possible to pass a large read current by providing the parallel transistor according to the present invention.

Figure 50:
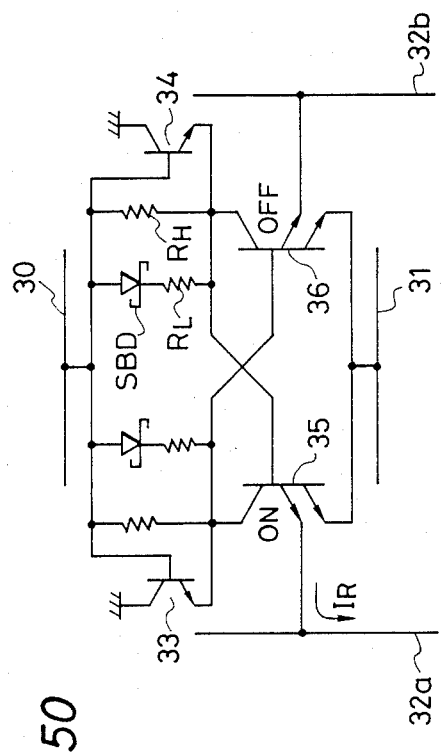
Figure 51A:
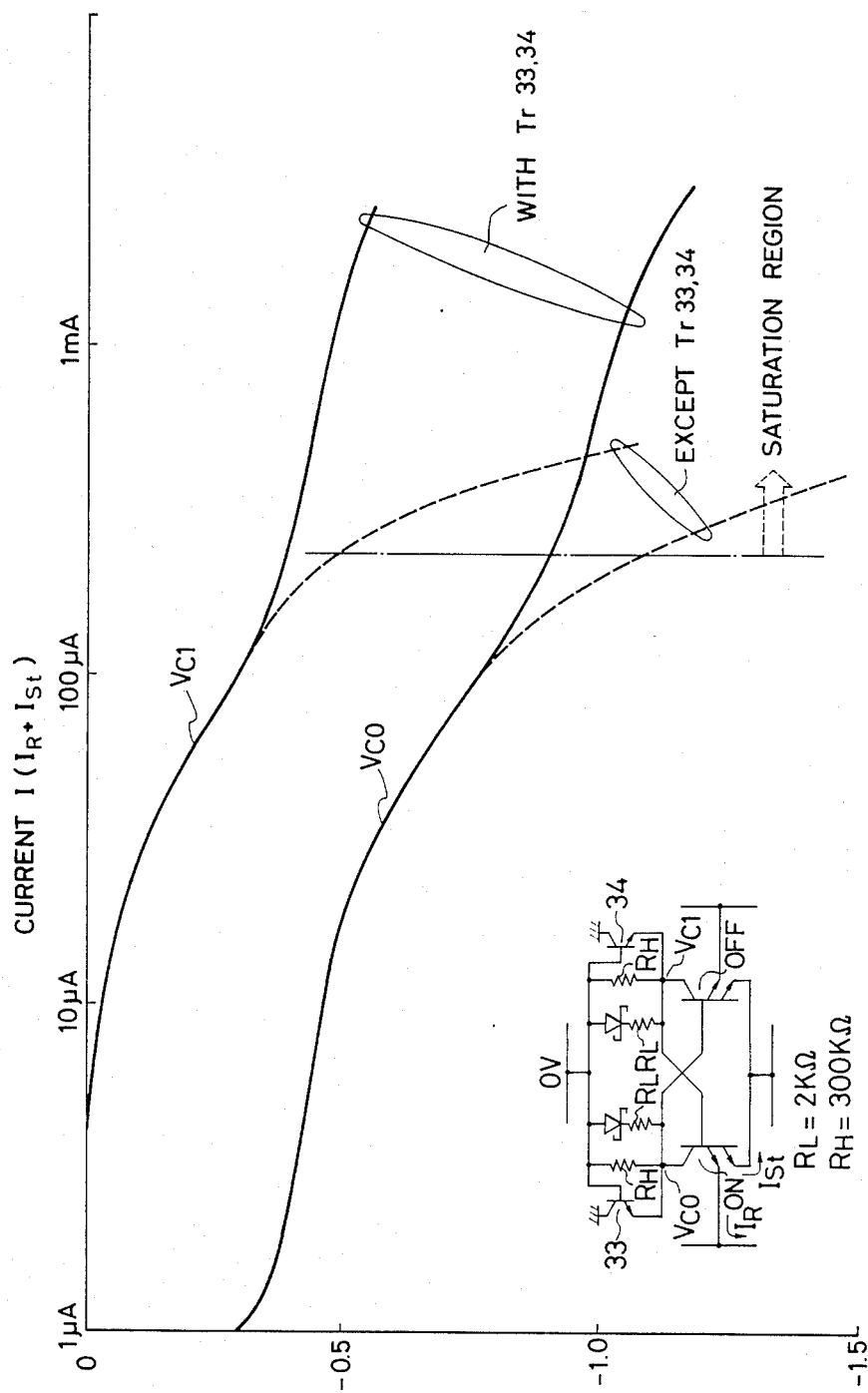

FIG. 50 shows a circuit diagram of according to a further embodiment of the present invention. This memory cell differs from the conventional memory cell of FIG. 48A in that a transistor 33 (or 34) is further connected in parallel to the conventional load device (a circuit obtained by connecting a high resistance $R_H$ in parallel with a series circuit of the SBD and a low resistance). Namely, the base of the transistor 33 or 34 is connected to an upper word line, the collector is connected to ground Vcc (the collector may be connected to an appropriate potential other than the ground), and the emitter is connected to the collector of a flip-flop transistor constituting the memory cell. Therefore, where the series resistance $R_L$ for the SBD is high and when the voltage drop across the SBD and the resistance $R_L$ due to the read current $I_R$ exceeds the base-emitter forward voltage $V_{BE}$ of the transistor 33 or 34, the transistor 33 or 34 is caused to conduct, thereby permitting the read current to bypass therethrough and clamping the collector potential of the memory cell. Without this clamping effect, the voltage drop across the resistor $R_L$ would be large, and an on-transistor 35 would be saturated. After the start of the saturation, $h_{FE}$ is reduced, the base current increases and the base voltage falls substantially following up to the collector voltage. The current dependence of the collector potential in this type of memory cell is shown in FIG. 51A. In the figure, the total current flowing through the memory cell (the sum of the read current $I_R$ and the stand-by current $I_{st}$) is taken on the abscissa, whereas the collector potential (high voltage) $V_{C1}$ of the off-transistor 36 and the collector potential (low voltage) $V_{C0}$ of the on-transistor 35 are taken on the ordinate. The collector potential is measured with the word line as a reference (0 V). The solid lines show $V_{C1}$ and $V_{C0}$ for the memory cell according to the present invention, shown in FIG. 50, and they show that the memory cell can be used without causing saturation of the transistors in a read current range of up to several milliamperes. On the other hand, the broken lines show the current dependence of the collector currents in a memory cell without the clamping transistors 33, 34. It is seen that, because the series resistance for the SBD is as high as 2 K$\Omega$, the read current $I_R$ that can be passed is only 0.2 to 0.3 mA at maximum. Delay times of a memory cell array and a sensing circuit are determined by the read current. According to the result of a simulation, when the read current is increased, for instance, from 0.2–0.3 mA to 2 mA, the access time can be reduced to about ⅓ times the original value.

Figure 51B:
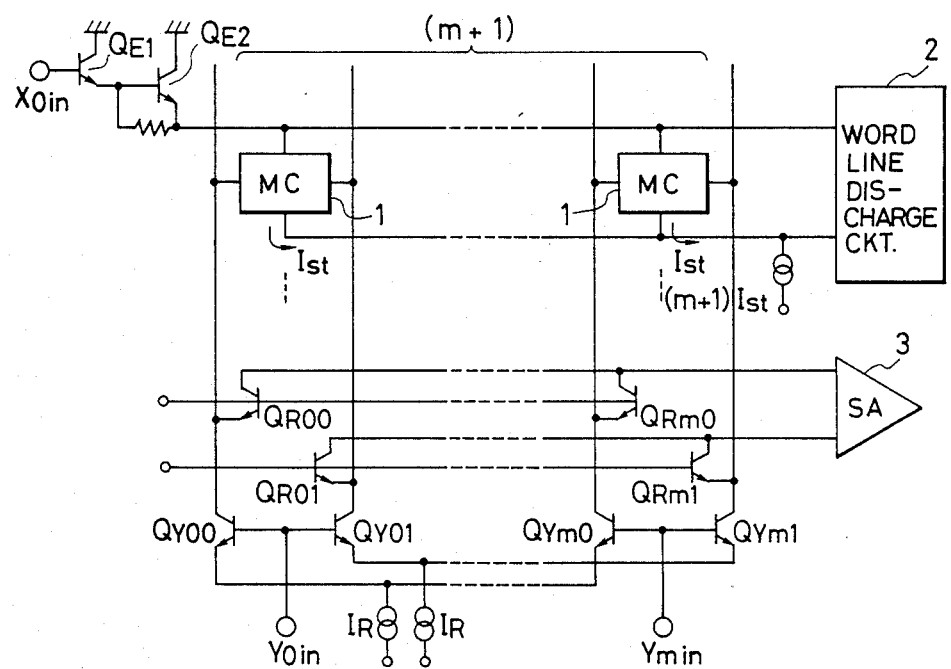

FIG. 51B shows an embodiment of a memory array constructed by using memory cells having the thus mentioned characteristic in such a form as to make the most of the high speed nature of the cells. Because large currents can be passed through the memory cells according to the present invention, a large current can be used as the read current $I_R$, thereby achieving high-speed operation. In addition, a word line discharge circuit 2 is provided for accelerating the rise of the word line, and a large current can be passed also as the discharge current through the circuit, which permits higher-speed operation. Naturally, the word line discharge circuit may be of any type (for example, ISSCC Digest '76, pp. 188–189, '79, pp. 108–109, and '83, pp. 108–109).

Figure 52:
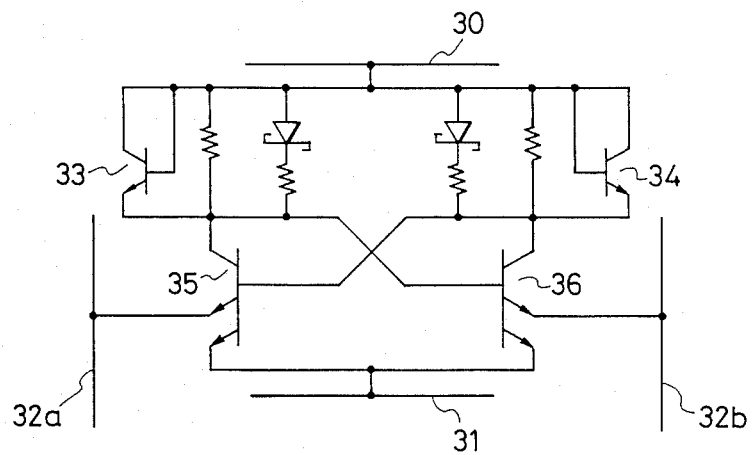

FIG. 52 shows a still further embodiment of the present invention, in which the collectors of the transistors 33, 34 shown in FIG. 50 are connected to the upper word line instead of ground. In this embodiment, although the area is slightly greater than that in the embodiment of FIG. 50, as will be described layer, the immunity from soft error is enhanced because no current flows between the n layer 24 and the n+ BL layer 20 upon shortcircuit therebetween because of the so-called funneling effect generated at the time of incidence of alpha rays.

Figure 53:
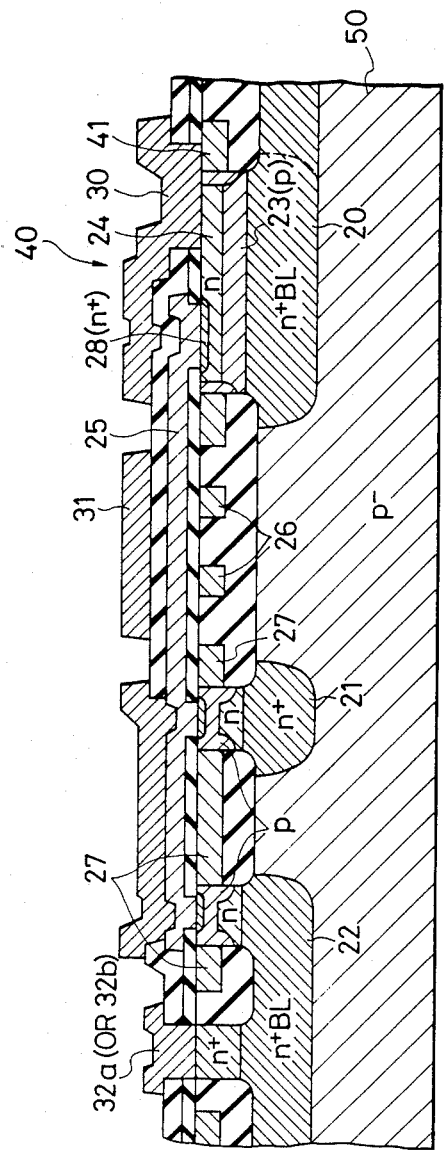

FIG. 53 shows a cross-sectional view of a memory cell according to the embodiment shown in FIG. 50 or 52. The transistors and the shield type devices may be of any construction. FIG. 53, like FIG. 49, illustrates an example based on the side wall base transistor construction mentioned in the above-described embodiment or the like. This embodiment differs from the above-mentioned embodiment (FIG. 49) in that the shield type SBD 40 is surrounded by a p+ type polycrystalline silicon 41, which is connected to the word line 30. In the prior art, only a reverse bias or such a low forward voltage (generally about 0.4 to 0.5 V) that the pn junction does not made conductive is applied to the cathode layer (n type layer) 24 and the p type layer 23, whereas in the present invention, the pn junction is made throughly conductive. With this operation, the n layer 24 functions as an emitter, the p layer 23 as a base and the n+ BL layer 20 as a collector resulting in a transistor action. Where the clamping transistor is operated as an emitter follower, the n+ BL layer 20 is connected to the power source $V_{cc}$, so that it may be provided in common with a similar n+ BL of the adjacent memory cell, as indicated by the solid line in FIG. 53. However, where the n+ BL 20 is connected with the word line, as in the embodiment shown in FIG. 52, it is natural that the n+ BL 20 must be separated from the n+ BL of the adjacent memory cell, as indicated by the broken line.

Figure 54:
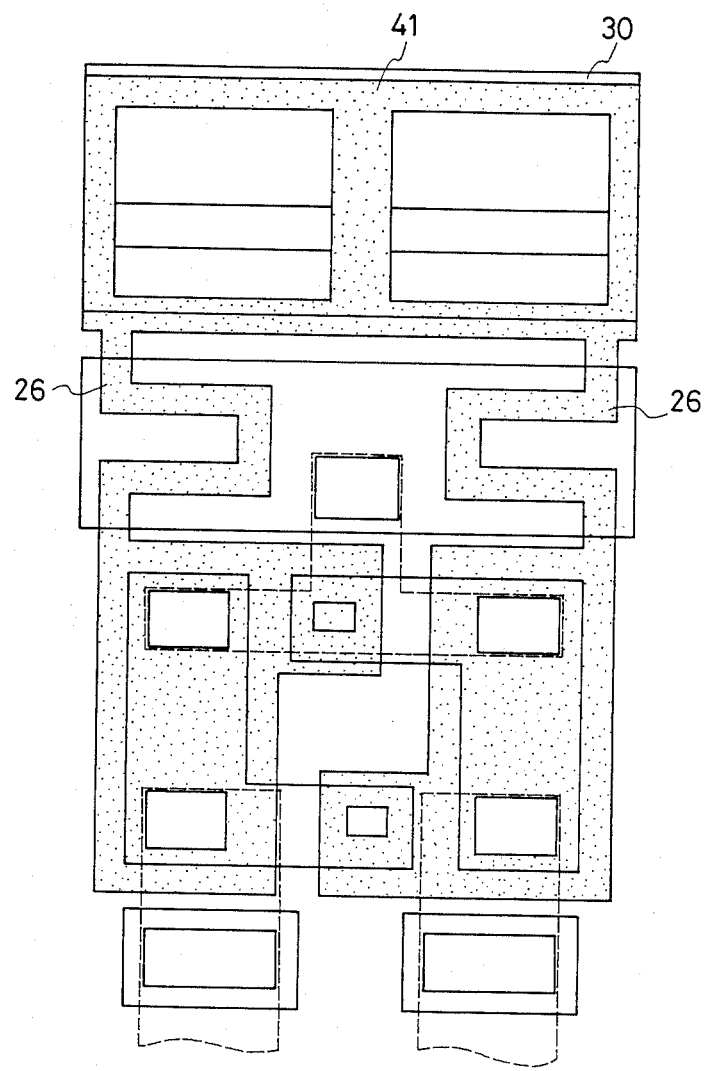

FIG. 54 illustrates an example of actual layout of the memory cell represented by the circuit diagram of FIG. 50. Because the p type polycrystalline silicon 41 is connected with the word line 30, as shown in FIG. 53, a high resistor 26 can be connected to the word line without need to provide a contact region 26' shown in FIG. 48B. Therefore, the area of the memory cell can be reduced. In addition, the n+ BL on the lower side of the shield type SBD (the collector of the clamping transistor, indicated at 20 in FIG. 53) is connected to ground ($V_{cc}$) at one part per several to several tens of memory cells (in some cases, only at both ends of the memory cell array), and the actual ratio of the number of the grounding parts to the number of the memory cells depends on the current flowing through the clamping transistor, resistivity of the n+ BL layer, etc. It is natural that the chip area can be reduced more as the number of connections to the ground is smaller.

Figure 55:
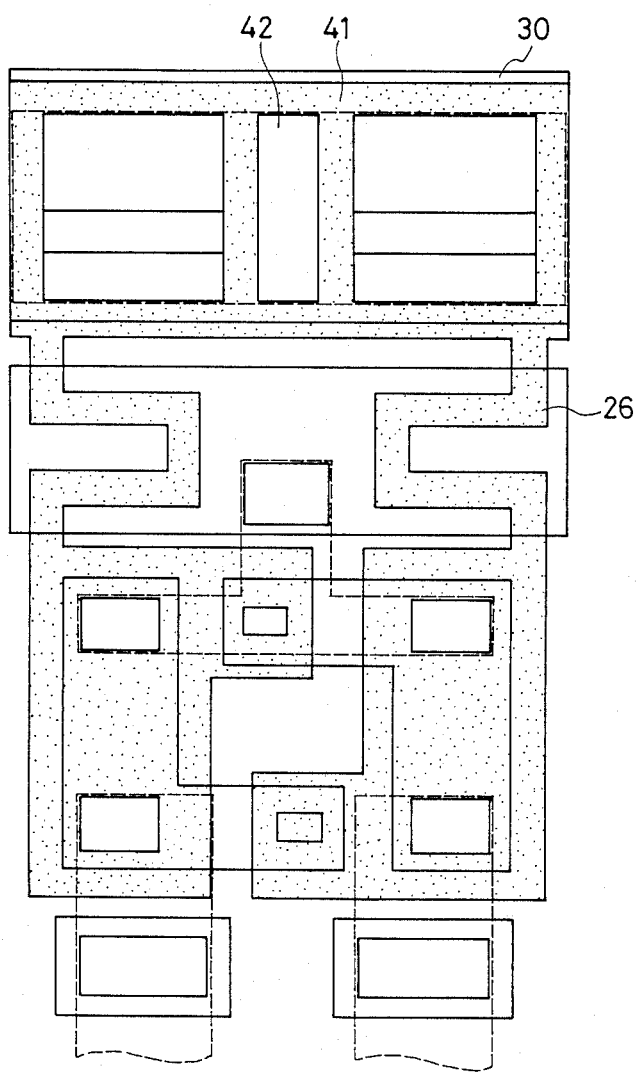

FIG. 55 shows an example of layout of the memory cell represented by the circuit diagram of FIG. 52. In this example, the n+ BL layer on the lower side of the shield SBD (the collector of the clamping transistor, indicated at 20 in FIG. 53) is connected to the word line 30. The connection may be made between the n+ BL and the word line at one part per several to several tens of memory cells, as in the example of FIG. 54, but in this example a silicon region 42 (structurally, an n+ region similar to the collector contact) is provided in each memory cell to thereby connect the word line (in this example, first Al layer) and the n+ BL (20 in FIG. 53).

Figure 56:
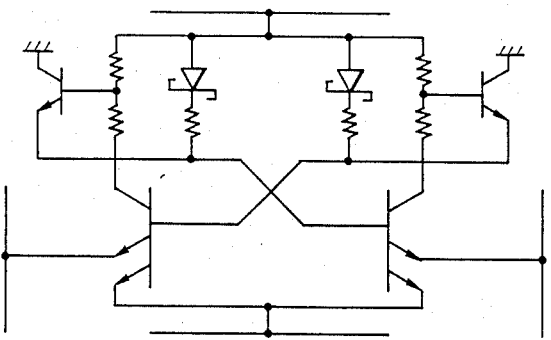

FIG. 56 shows a circuit diagram according to a yet further embodiment of the present invention. In this embodiment, the base of the clamping transistor is connected to the node where two high resistances are connected. Therefore, a desired clamping level can be obtained by proper selection of the dividing ratio of the high resistances, which permits a flexible designing.

Figure 57:
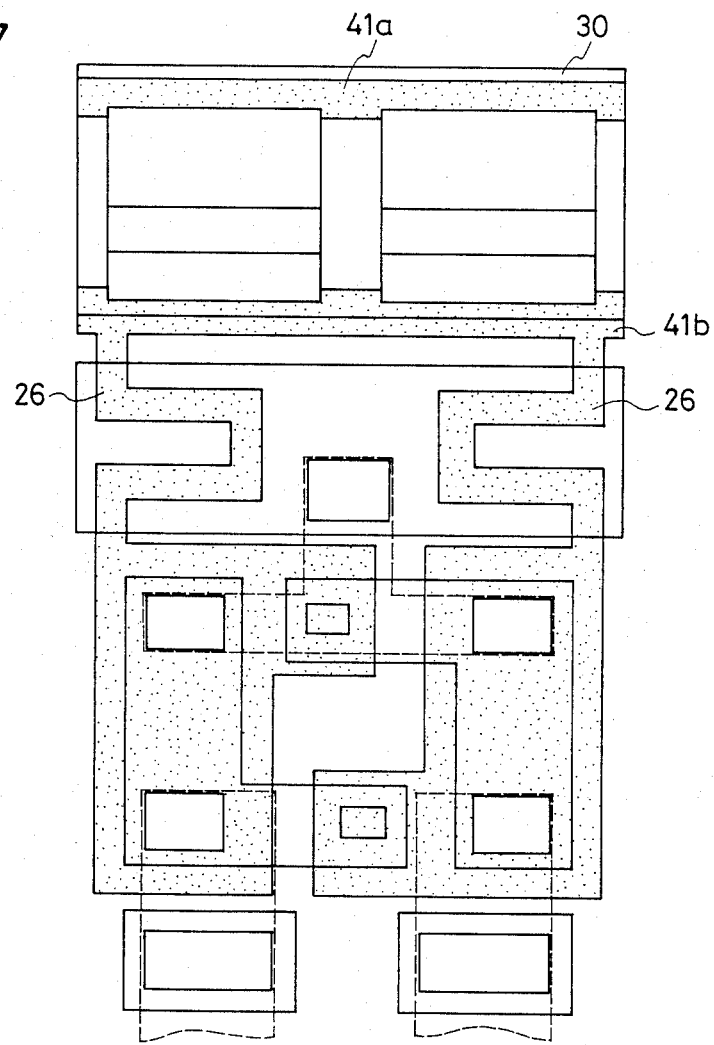
Figure 58:
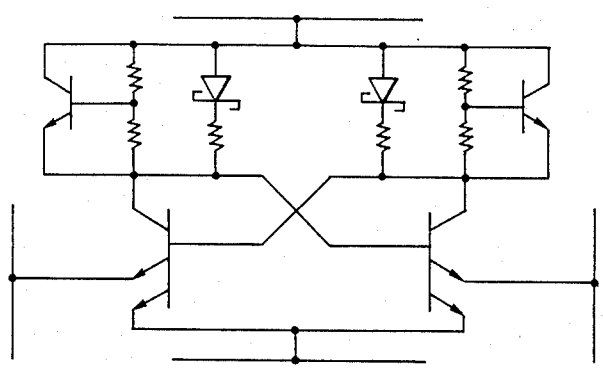

FIG. 57 shows an example of actual layout of the memory cell of FIG. 58. In this example, the polycrystalline silicon 40 surrounding the SBD in FIG. 54 is divided into 41a and 41b. In terms of the cross-sectional view of FIG. 53, therefore, the polycrystalline silicon 41 of this example does not surround the p type region 24 but is connected to the region 24 only at the left and right ends of the region 24. Accordingly, where the polycrystalline silicon 41a on the right side is connected to the upper word line 30, the resistor of the p layer 24 is connected in series with the resistance 26. Because the shield SBD 40 operates as a transistor in the vicinity of the n+ layer 28 (an ordinary emitter layer), the base of the clamping transistor is connected with the node where the resistance of the p layer 24 and the polycrystalline silicon 26 are connected. A desired resistance division ratio can be designed by proper selection of parameters such as impurity concentration, shape and thickness of each resistor. Naturally, the two resistors may be of any of constructions used in the prior art or in the future.

FIG. 58 shows a still further embodiment of the present invention, in which the base of the clamping transistor is connected to the division point of resistances, and the collector to the upper word line. With this construction, flexibility can be obtained in the design of the memory cell potential, and immunity from soft error can be improved.

Figure 59:
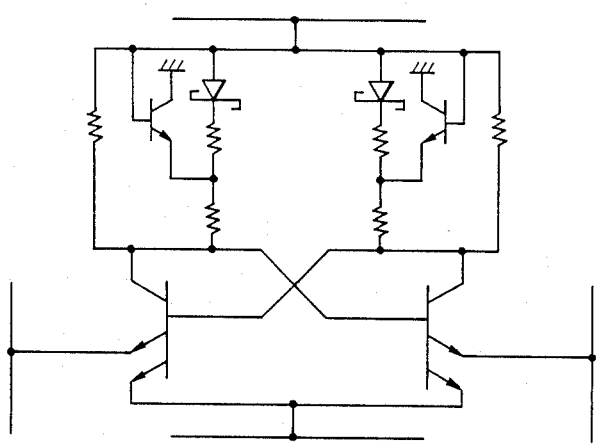

FIG. 59 shows a further embodiment of the present invention, in which a resistor $R_L'$ is connected between the collector of the memory cell transistor and the joint of the emitter of the clamping transistor and the series resistor for the SBD. With this construction, also, the degree of freedom in designing a low memory cell potential is increased, and flexible design can be permitted.

Figure 60:
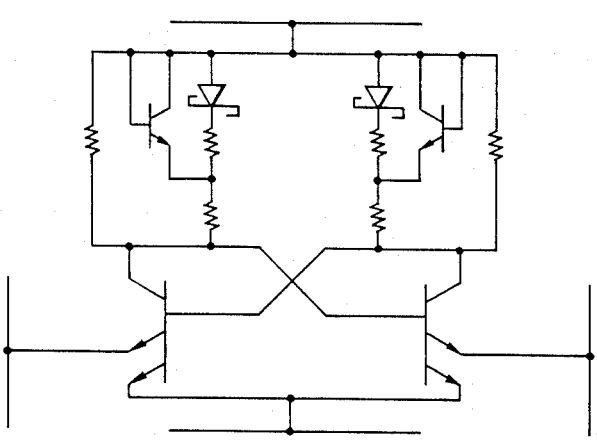

FIG. 60 shows a still further embodiment of the present invention, which also ensures flexible designing and increased immunity from soft error.

According to the present invention, by connecting a clamping transistor in parallel with each load in a memory cell of the type in which loads are selectively used under the function of SBDs, it is possible to obtain a large read current of at least several milliamperes even where the series resistor for the SBD has a high resistance, which has an eminent effect on high-speed operation of a high-capacity memory.

As apparent from the foregoing description, the present invention provides transistor constructions which facilitate the adjustment of the width of the base, have a small parasitic capacitance and have the immunity from noise.

Naturally, the present invention is effective also when the p type and the n type are inverted to n type and p type, respectively Although the invention has been described in its preferred forms with a certain degree of particularity, it is to be understood that various changes and modifications may be made in the invention without departing from the spirit and scope thereof.

What is claimed is:

1. A semiconductor memory comprising: a semiconductor substrate; memory cells each of which is constituted of a flip flop consisting of first and second inverse-mode transistors formed on the semiconductor substrate, and first and second load devices which has bipolar transistor formed on the semiconductor substrate; word lines for selecting one of the memory cells; bit lines for reading and writing information of the selected memory cell; and coupling devices for electrically interconnecting the bit lines and the memory cell, wherein the n+ buried layers of the first and second transistors, are isolated from the n+ buried layers of the first and second load devices and/or from the n+ buried layers of the coupling devices, and the first and second transistors employ the n+ buried layers as emitters, respectively.

2. A semiconductor memory according to claim 1, wherein said flip flop is constructed by interconnecting the base of said first transistor and the collector of the second transistor and interconnecting the collector of said first transistor and the base of said second transistor, and said load devices are Schottky barrier diodes electrically connected to the nodes where the collectors and bases of said first and second transistors are connected.

3. A semiconductor memory according to claim 2, wherein said Schottky barrier diodes have shielding means for shielding the Schottky barrier diodes from noise produced within the semiconductor substrate.

4. A semiconductor memory according to claim 3, wherein said shielding means is a doped region of the same conduction type as that of said semiconductor substrate, and a desired voltage is applied to said doped region.

5. A semiconductor memory according to claim 1, wherein said flip flop is constructed by interconnecting the base of said first transistor and the collector of said second transistor and interconnecting the collector of said first transistor and the base of said second transistor, said load devices are first and second pnp transistors, the collector of said first pnp transistor is connected to the base of said first transistor and the collector of said second transistor, the collector of said second pnp transistor is connected to the base of said second transistor and the collector of said first transistor, and the emitters of said first and second pnp transistors are electrically connected to said word lines.

6. A semiconductor memory according to claim 5, wherein said pnp transistors have shielding means for shielding the pnp transistors from noise produced within said substrate.

7. A semiconductor memory according to claim 6, wherein said shielding means is a doped region of the same conduction type as that of said semiconductor substrate, and a desired voltage is applied to said doped region.

8. A semiconductor memory comprising: a semiconductor substrate; bipolar transistors formed on the semiconductor substrate; a memory cell array comprising a plurality of memory cell circuits arranged along word lines or bit lines, said memory cell circuit including at least two cross-coupled inverse-mode transistors of first type isolated from each other; each of said first type transistors having a first layer of first conductivity type buried in said semiconductor substrate and serving as an emitter, a second layer formed over the first type conductive doped layer and serving as a base and a third layer formed over the second layer; a collector load device for said memory cell circuit including a transistor of second type (different type from said first type); the bases of said first type and second type transistors being interconnected to construct a pnpn transistor; a fourth layer of the same type as that of the emitter of said first type transistor being formed below said second type transistor; and said fourth layer being connected to the word line, the bit line, a signal line like the word or bit line or a power supply line.

9. A semiconductor memory comprising: a semiconductor substrate; a memory cell array comprising a plurality of memory cells arranged along the word lines and the bit lines and having at least two separate inverse-mode transistors cross-coupled each other; each said transistor having a first layer of first conductivity type formed in said semiconductor substrate and serving as an emitter, a second layer of second conductivity type formed over said first layer and a third layer of the same conduction type as the first conductivity type and serving as a collector; and a collector load device for each of said memory cells having, as a component, a layer of the same conductivity type as said first conductivity type, connected to the word line, bit line, signal line like the word or bit line or a power source.

10. A semiconductor memory according to claim 9, wherein the base contact of each of said transistor is formed on the side surface of said layer of the second conductivity type formed in a convex semiconductor land.

11. A semiconductor memory comprising memory cells each of which comprises at least two transistors with the collectors and bases cross-coupled, a first load circuit comprising a series circuit of a first resistor and a diode having a low forward voltage characteristic, said diode connected between the collector of each said transistor and a word line, and a second load resistor comprising a second resistor connected between the collector of said transistor and said word line, each said memory cell further comprising clamping transistors each having the collector connected to a power source or said word line, the base connected to said word line or an intermediate point of said second resistor, and the emitter connected to the collector of said transistor or an intermediate point of said first resistor.

12. A semiconductor memory cell according to claim 11, wherein each said clamping transistor is a transistor using as an emitter layer an n type silicon layer of the cathode of a Schottky barrier diode.

* * * * *